United States Patent
Tanaka

(10) Patent No.: US 6,721,041 B2
(45) Date of Patent: Apr. 13, 2004

(54) STAGE DEVICE AND EXPOSURE APPARATUS

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/314,140

(22) Filed: Dec. 9, 2002

(65) Prior Publication Data

US 2003/0128350 A1 Jul. 10, 2003

Related U.S. Application Data

(62) Division of application No. 09/722,631, filed on Nov. 28, 2000, now Pat. No. 6,509,957.

(30) Foreign Application Priority Data

Dec. 1, 1999 (JP) .......................................... 11-341844

(51) Int. Cl.[7] .......................... G03B 27/58; G03B 27/42
(52) U.S. Cl. ........................................ 355/72; 355/53
(58) Field of Search ....................... 355/53, 67, 72–76; 356/399–401, 359, 363, 500; 250/548

(56) References Cited

U.S. PATENT DOCUMENTS 3,736,880 A   6/1973   Ross
4,742,286 A   5/1988   Phillips (List continued on next page.)

FOREIGN PATENT DOCUMENTS

| EP | 0 816 892 A2 | 1/1998 |
| EP | 0 951 054 A1 | 10/1999 |
| JP | 9-320956 | 12/1997 |
| JP | 10-214783 | 8/1998 |
| WO | WO 98/40791 | 9/1998 |

Primary Examiner—Henry Hung Nguyen
(74) Attorney, Agent, or Firm—Oliff & Berridge PLC

(57) ABSTRACT

A stage device includes a first stationary member, a second stationary member, a moving member and positioning devices. The first stationary member extends in a first direction. The second stationary member extends in the first direction and is spaced apart from the first stationary member in a second direction perpendicular to the first direction. The moving member can cooperate with the first stationary member and with the second stationary member. The positioning devices selectively position the moving member into cooperation with one of the first and second stationary members without physically contacting the moving member with the first and second stationary members. In addition, a stage device provided with a moving member that can move within a two-dimensional plane having a first direction and a second direction perpendicular to the first direction includes a first stationary member and a second stationary member. The first stationary member extends in the first direction and is supported at a first position in a third direction that is perpendicular to the two-dimensional plane. The second stationary member extends in the first direction and is supported at a second position in the third direction, different from the first position. The moving member has a first part that can cooperate with the first stationary member, and a second part that can cooperate with the second stationary member. When two stages are replaced, generation of a positional shift on an object on the stages is prevented, and separate processing can be performed simultaneously with respect to objects on the stages.

17 Claims, 14 Drawing Sheets

U.S. PATENT DOCUMENTS

| | | |
|---|---|---|
| 4,780,617 A | 10/1988 | Umatate et al. |
| 5,031,976 A | 7/1991 | Shafer |
| 5,073,912 A | 12/1991 | Kobayashi et al. |
| 5,208,497 A | 5/1993 | Ishii et al. |
| 5,220,454 A | 6/1993 | Ichihara et al. |
| 5,467,720 A | 11/1995 | Korenaga et al. |
| 5,473,410 A | 12/1995 | Nishi |
| 5,488,229 A | 1/1996 | Elliott et al. |
| 5,668,672 A | 9/1997 | Oomura |
| 5,684,856 A | 11/1997 | Itoh et al. |
| 5,689,337 A | 11/1997 | Lamb, Jr. et al. |
| 5,715,064 A | 2/1998 | Lin |
| 5,717,518 A | 2/1998 | Shafer et al. |
| 5,835,275 A | 11/1998 | Takahashi et al. |
| 5,969,441 A | 10/1999 | Loopstra et al. |
| 6,020,964 A * | 2/2000 | Loopstra et al. ............. 356/358 |
| 6,023,320 A * | 2/2000 | Kawashima .................. 355/53 |
| 6,208,407 B1 | 3/2001 | Loopstra |
| 6,285,457 B2 * | 9/2001 | Ukaji ......................... 356/500 |
| 6,327,022 B1 * | 12/2001 | Nishi ........................ 355/53 |
| 2002/0026878 A1 | 3/2002 | Kwan et al. |

* cited by examiner

STAGE DEVICE AND EXPOSURE APPARATUS

This is a Division Application No. 09/722,631 filed Nov. 28, 2000, which is now U.S. Pat. No. 6,509,957.

The entire disclosure of the prior application is hereby incorporated by reference herein in its entirety.

INCORPORATION BY REFERENCE

The disclosure of the following priority application is incorporated herein by reference in its entirety: Japanese Patent Application No. 11-341844 filed Dec. 1, 1999.

BACKGROUND OF THE INVENTION

1. Field of the Invention

This invention relates to a stage device and an exposure apparatus, and more particularly to a stage device provided with a plurality of stages and an exposure apparatus provided with the stage device.

2. Description of Related Art

Conventionally, various exposure apparatus are used to fabricate a semiconductor device (integrated circuit), a liquid crystal display device, or the like by a photolithographic process. Recently, as semiconductor devices have become highly integrated, reduction projection exposure apparatus such as a step•and•repeat type projection exposure apparatus (a so-called stepper) and a step•and•scan type scanning projection exposure apparatus (a so-called scanning•stepper), that improves upon the stepper, have been widely used.

These types of projection exposure apparatus are predominantly used for the production of semiconductor devices. Therefore, processing capability as to how many wafers can be exposure-processed within a predetermined time, that is, throughput needs to be improved.

The following shows the main processes performed in these types of projection exposure apparatus.

(a) First, a wafer loading process is performed that loads a wafer onto a wafer holder of a wafer (substrate) stage by using a wafer loader.

(b) Next, a search alignment process is performed that performs position detection of the wafer by a search alignment mechanism. Specifically, the search alignment process is performed by, for example, using the image of the wafer as a reference or by detecting a search alignment mark on the wafer.

(c) Subsequently, a fine alignment process is performed that accurately obtains the position of each shot region on the wafer (each shot region corresponds to an area where a circuit pattern will be formed). This fine alignment process typically uses an EGA (Enhanced•Global•Alignment) method. In this method, arrangement data for all shot regions on the entire wafer can be obtained (see U.S. Pat. No. 4,780,617) by selecting a plurality of sample shot regions on the wafer, measuring the position of an alignment mark (wafer mark) arranged in the sample shots, and by performing statistical calculation by a so-called least squares method or the like based on this measurement result and a designed value of shot arrangement. Then, a coordinate position of each shot region can be obtained with high throughput and with relatively high accuracy.

(d) Next, an exposure process is performed in which an image of a pattern of a reticle (mask) is transferred onto the wafer (substrate) via a projection optical system as each shot region on the wafer is sequentially positioned at an exposure position based on a base alignment amount that was measured in advance and a coordinate position of each shot region obtained by the above-mentioned EGA method or the like.

(e) Next, a wafer unloading process is performed that unloads the wafer that has been exposure-processed from the wafer stage by using a wafer unloader. This wafer unloading process is simultaneously performed with the above-mentioned (a) wafer loading process for the next wafer to be exposure-processed. That is, a wafer replacement process is constituted by steps (a) and (e).

Thus, in a conventional projection exposure apparatus, three significant operations, such as: (1) wafer replacement; (2) alignment (search alignment, fine alignment); (3) exposure; and (4) wafer replacement, or the like, are repeated by using one wafer stage.

Even if some of the plurality of operations within the above-mentioned three operations, that is, wafer replacement, alignment, and exposure operation, can be performed simultaneously, throughput can be improved compared to the case when these operations are sequentially performed. Exposure of a wafer is not performed during wafer replacement and alignment, and thus in order to improve shortening of process time, that is, throughput, for example, a method can be considered that simultaneously independently controls a first stage in which wafer replacement and alignment are performed and a second stage in which exposure is performed.

With respect to this concept, for example, International Publication No. WO98/40791 discloses a stage device (positioning device) that independently drives two stages in parallel in a two-dimensional X-Y plane. This device provides a pair of driving mechanisms that are symmetrically arranged. Each driving mechanism has a stationary member of an X driving linear motor, opposite ends of which are attached to a respective one of two moving elements of a Y-axis linear motor of that driving mechanism. The moving elements of each Y-driving linear motor drive its stage in the Y-axis direction by a driving force of this Y driving linear motor. The stage device also has rigid connection mechanisms (coupling mechanisms) that couple a side of a stage (object holder) that faces the moving member of the X driving linear motor to that moving member. Thus, the two stages are coupled to the respective driving mechanisms by the respective connection mechanisms.

However, in the positioning device described in the above-mentioned WO98/40791, a rigid connection mechanism is used to couple respective stages to respective driving mechanisms. This rigid connection mechanism includes movable parts that are moved along with the stages, and therefore the weight of the movable parts becomes heavy. As a result, positioning control is not sufficiently assured with respect to the stages. Furthermore, in this positioning device, as described. above, a rigid connection mechanism is used, and therefore a shock force generated during connection (during coupling) may cause a positional shift of a semiconductor substrate (wafer) on the stage. Additionally, as clarified from FIG. 2 or the like of the above-mentioned International Publication, a point of application of thrust of the stages is displaced from the center of gravity, so that rotational moment is generated.

SUMMARY OF THE INVENTION

This invention has been made in view of the above circumstances. One object of this invention is to provide a stage device that prevents a shock force from acting on a movable body when the movable body is positioned with respect to two stationary side members and that prevents an object that is to be mounted on the movable body from being positionally shifted.

Another object of this invention is to provide a stage device that can prevent a shock force from acting on the stages when the two stages are replaced and can simultaneously separately process objects mounted on the stages.

Another object of this invention is to provide an exposure apparatus that improves the ability to control the position of a substrate on a stage and simultaneously improves throughput.

The stage device according to one aspect of the invention includes a first stationary member, a second stationary member, a moving member and positioning devices. The first stationary member extends in a first direction. The second stationary member extends in the first direction and is spaced apart from the first stationary member in a second direction perpendicular to the first direction. The moving member can cooperate with the first stationary member and with the second stationary member. The positioning devices selectively position the moving member into cooperation with one of the first and second stationary members without physically contacting the moving member with the first and second stationary members.

In this specification, "cooperation" means any type of mutual interaction, for example, electromagnetic mutual interaction (including both electromagnetic mutual interaction and magnetic mutual interaction) that is performed between a stationary member and a moving member so that a driving force (thrust) that relatively drives the stationary member and the moving member relative to each other is generated. Furthermore, in this specification, a "first direction" and a "second direction" have the same meaning as a first-axis direction and a second-axis direction. Therefore, when these words are used in relation to an operation, movement from one side to the other side along a first axis (e.g., Y axis) and along a second axis (e.g., X axis), as well as movement in the opposite direction, are included.

According to this aspect of the invention, the moving member can be selectively positioned into cooperation non-contactingly with one of the first stationary member and the second stationary member. Because of this, when positioning the moving member into cooperation with the stationary member, unlike in the case of the above-mentioned rigid connection mechanism, a shock force does not act on the moving member. Accordingly, this can prevent an object mounted on the moving member from having a positional shift.

In accordance with another aspect of the invention, a stage device provided with a moving member that can move within a two-dimensional plane having a first direction and a second direction perpendicular to the first direction includes a first stationary member and a second stationary member. The first stationary member extends in the first direction and is supported at a first position in a third direction that is perpendicular to the two-dimensional plane. The second stationary member extends in the first direction and is supported at a second position in the third direction, different from the first position. The moving member has a first part that can cooperate with the first stationary member, and a second part that can cooperate with the second stationary member.

In this specification, a "third direction" has a meaning that is the same as a third-axis direction. In the case of using a "third direction" in relation to an operation, movement from one side to the other side of a third axis (e.g., Z axis) and movement in the opposite direction are included.

According to this aspect of the invention, the first stationary member is supported at the first position in the third direction, the second stationary member is supported at the second position in the third direction, and the moving member has the first part that can cooperate with the first stationary member and the second part that can cooperate with the second stationary member. Because of this, by moving the moving member toward the first stationary member, the moving member can be non-contactingly positioned at a position in which the first part of the moving member can cooperate with the first stationary member. Additionally, by moving the moving member toward the second stationary member, the moving member can be non-contactingly positioned at a position in which the second part of the moving member can cooperate with the second stationary member. Thus, the moving member can be non-contactingly positioned at a position in which cooperation can be established with the first and second stationary members. Because of this, a shock force does not occur, which adversely affects the moving member, unlike in the case of the above-mentioned rigid connection mechanism. Therefore, generation of a positional shift to an object mounted on the moving member can be prevented.

In this case, as described above, while the moving member cooperates with one of the first stationary member and the second stationary member, driving devices can also be provided that can drive the moving member and one of the stationary members in the second direction.

A stage device according to another aspect of the invention includes a first stationary side member, a second stationary side member, a first stage, a second stage and replacement devices. The first stationary side member includes a first stationary member that extends in a first direction. The second stationary side member includes a second stationary member that extends in the first direction and is spaced from the first stationary member in a second direction perpendicular to the first direction. The first stage can cooperate with the first stationary member and with the second stationary member, and has a first moving member that can receive a thrust in the first direction when it is in cooperation with either the first stationary member or the second stationary member. The second stage can cooperate with the first stationary member and with the second stationary member, and has a second moving member that can receive a thrust in the first direction when it is in cooperation with either the first stationary member or with the second stationary member. The replacement devices can non-contactingly replace the first and second stages with respect to the first and second stationary side members.

Because the replacement devices can non-contactingly replace the first and second stages with respect to the first and second stationary side members, during the replacement, a shock force does not affect the respective stages, unlike in the case of the above-mentioned rigid connection mechanism. Thus, generation of a positional shift in an object (e.g., a substrate) mounted on the respective stages can be prevented. Furthermore, the first stage has a first moving member that can cooperate with the first stationary member or with the second stationary member and that receives a thrust in the first direction during the cooperation, and the second stage has a second moving member that can cooperate with the first stationary member or with the second stationary member and that receives a thrust in the first direction during the cooperation. Therefore, both stages can be independently driven simultaneously at least in the first direction. Accordingly, separate processing operations can be simultaneously performed for the object mounted on the respective stages.

In addition, the replacement devices can also be provided with an adjustment device that adjusts an interval in the second direction between the first stationary side member and the first moving member. In this case, the interval in the second direction between the first stationary side member and the first moving member can be adjusted by the adjustment device, so that the first moving member can be non-contactingly supported in the second direction for the first stationary side member so that this interval has an appropriate dimension and is maintained constant. At the same time, the first moving member can be substantially accurately guided non-contactingly in the first direction along with the first stationary side member. In this case, the replacement devices can also be provided with an adjustment device that adjusts the interval in the second direction between the first moving member and the second stationary side member, and adjustment devices that respectively adjust the interval in the second direction between the second moving member and respective ones of the first and second stationary side members.

According to another aspect of the invention, it is preferable that a plurality of the adjustment devices are arranged in the first direction. In this case, by adjusting the interval in the second direction between the first moving member and the first stationary side member at a plurality of points at different positions in the first direction, axial rotation about the third direction of the first stage can be adjusted.

Various different structures can be used as adjustment devices in the above aspects of the invention. For example, the adjustment devices can have an electromagnet arranged in the first moving member and magnetic body members arranged in the first stationary side member. In this case, the interval in the second direction between the first moving member and the first stationary side member can be adjusted by adjusting a magnetic force (magnetic attraction for the magnetic body member) that is electromagnetically generated.

It is preferable that the point of application of thrust in the first direction for the first and second stages is set at a position that passes through the center of gravity of the respective stages. In this case, rotation of the first stage when the first stage is driven in the first direction by cooperation between the first moving member and the first or second stationary member can be prevented, and rotation of the second stage when the second stage is driven in the first direction by cooperation between the first or second stationary member and the second moving member can be prevented.

According to another aspect of the invention, the stage device having a first stage and a second stage that can be independently moved in a two-dimensional plane having a first direction and a second direction perpendicular to the first direction includes a first stationary member and a second stationary member. The first stationary member extends in the first direction and is supported at a first position in a third direction that is perpendicular to the two-dimensional plane. The second stationary member extends in the first direction and is supported at a second position different from the first position in the third direction. A first stage includes a first moving member having a first part that can cooperate with the first stationary member, and a second part that can cooperate with the second stationary member. A second stage includes a second moving member having a first part that can cooperate with the first stationary member and a second part that can cooperate with the second stationary member.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
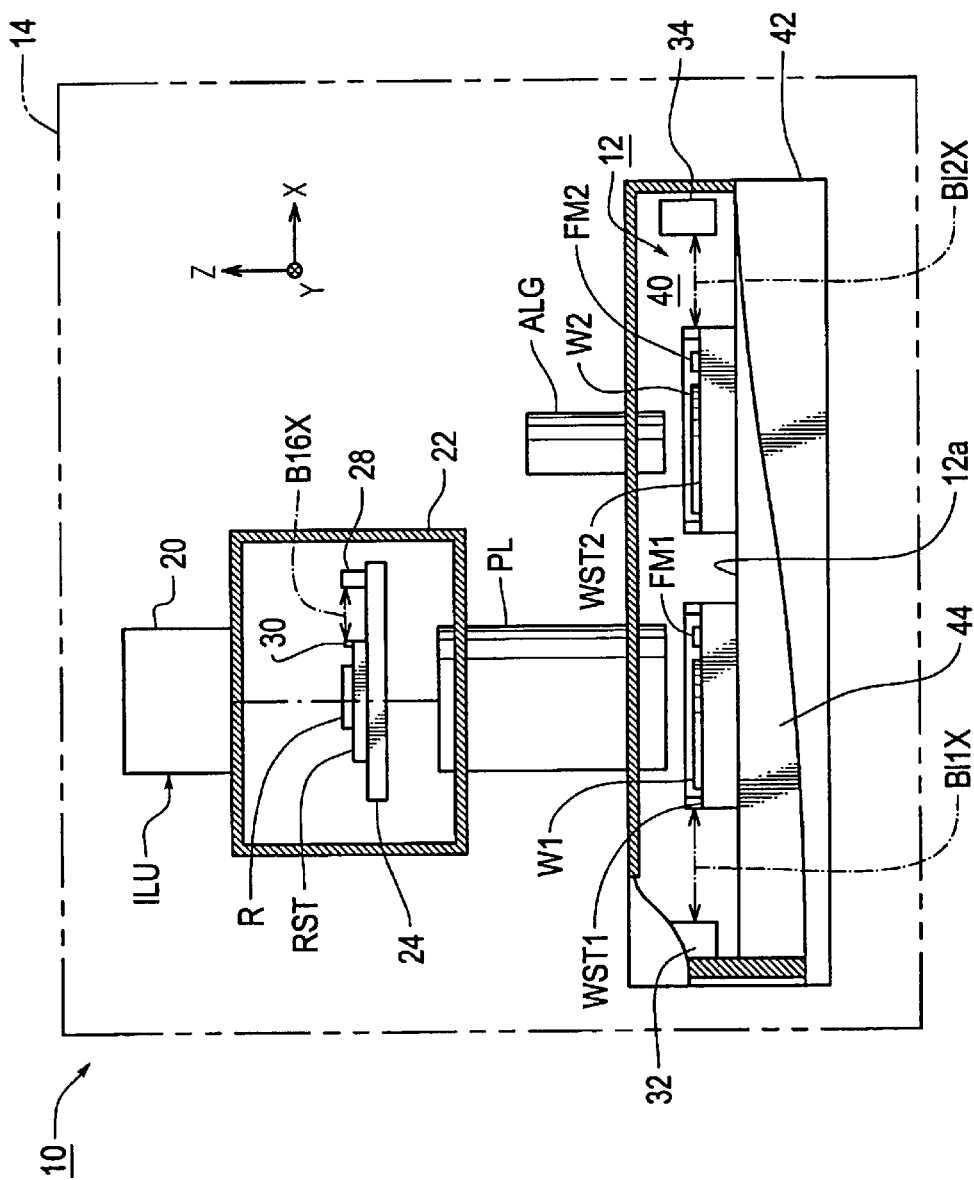
FIG. 1 is a diagram schematically showing a structure of an exposure apparatus according to one embodiment of the invention.

One embodiment of this invention will be explained with reference to FIGS. 1–14. FIG. 1 shows a schematic structure of an exposure apparatus 10 according to one embodiment of this invention. This exposure apparatus 10 is a so-called step•and•scan type scanning exposure apparatus.

Exposure apparatus 10 includes an undepicted light source, an illumination unit ILU, a reticle driving system, a projection optical system PL and a stage device 12. The light source and the illumination unit ILU constitute an illumination system that illuminates a reticle R (a mask) from an upper direction by an exposure illumination light. The reticle driving system drives the reticle R mainly in a predetermined scanning direction, that is, a Y-axis direction (direction perpendicular to the plane of the paper in FIG. 1), also referred to herein as a "first direction." The projection optical system PL is arranged under the reticle R. Wafer stages WST1 and WST2 (the first and second stages) are part of the stage device 12, and are arranged under the projection optical system PL. Wafer stages WST1 and WST2 hold the respective wafers W1 and W2 (substrates), and are independently moved in an XY two-dimensional plane.

The above-mentioned components, excluding the undepicted light source, are stored within an environment control compartment (hereafter referred to as "compartment") 14 that is arranged on a floor surface of a super-clean room and in which temperature, humidity, and the like is accurately controlled.

The light source can be various light sources such as, for example, a pulse laser light source that outputs a pulsed ultraviolet ray in a vacuum ultraviolet wavelength region. Such light sources can be, for example, an $F_2$ laser light source (output wavelength 156 nm), an ArF excimer laser light source (output wavelength 193 nm), or the like. This light source can be arranged in another clean room in which the degree of cleanliness is lower than that of the super-clean room in which the compartment 14 is arranged. The light source also could be arranged in a service space beneath the floor of the clean room and be connected to the illumination unit ILU within the compartment 14 via an undepicted connecting optical system.

Figure 11:
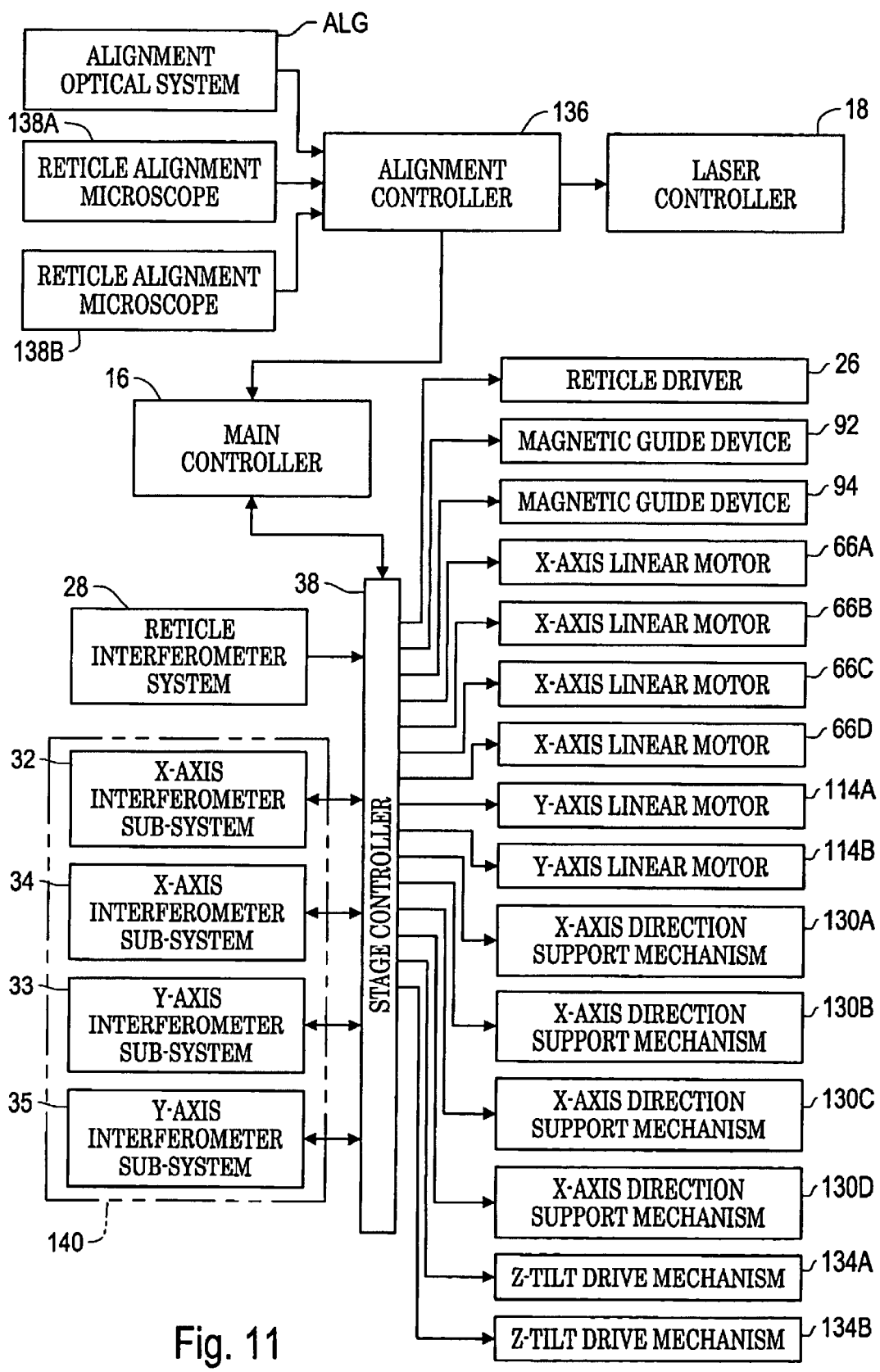
FIG. 11 is a block diagram showing the basic components of a control system in an exposure apparatus according to the first embodiment.

The frequency of the pulse light (oscillating frequency), pulse energy, or the like emitted by the light source is controlled by a laser controller 18 (not depicted in FIG. 1, but depicted in FIG. 11) under the instructions of a main controller 16 (see FIG. 11).

Other types of light sources can be used, including, for example, a vacuum ultraviolet light source such as an $Ar_2$ laser light source (output wavelength 126 nm) or an ultraviolet light source such as a KrF excimer laser light (output wavelength 248 nm). The exposure light also can be, for example, ultraviolet bright lines (g-rays and i-rays) output from an extra-high pressure mercury lamp.

The illumination unit ILU is constituted by an illumination system housing 20, which is air-tight with respect to outside air, and that holds an illumination optical system constituted by a secondary light-source forming optical system (optical integrator), a beam splitter, a light-collecting lens system, a reticle blind, an imaging lens system (all undepicted), and the like. The illumination unit ILU illuminates a rectangular (or arcuate) illumination region IAR (see FIG. 2) on the reticle R having uniform illuminance. One possible illumination optical system is disclosed in, for example, Japanese Laid-Open Patent Application No. 9-320956 (also see U.S. Pat. No. 5,473,410).

Clean helium gas (He), dry nitrogen gas ($N_2$), or the like having an air (oxygen) concentration that is less than several ppm is supplied within the illumination system housing 20.

The reticle driving system is housed within the reticle compartment 22 shown in FIG. 1. A light transmission window is formed in the portion that connects the reticle compartment 22 with the illumination system housing 20. The light transmission window can be made of fluorite or the like. Clean helium gas (He), dry nitrogen gas ($N_2$), or the like having an air (oxygen) concentration that is approximately several ppm is filled within the reticle compartment 22.

The reticle driving system includes a reticle stage RST that holds the reticle R on a reticle base plate 24, which is shown in FIG. 1. The reticle stage RST can move within a two-dimensional X-Y plane, and is driven in this plane by a driver 26 (see FIG. 11) that includes undepicted linear motors or the like. A reticle interferometer system 28 also is provided within compartment 22.

The reticle stage RST is floatingly supported on (over) the reticle base plate 24 via an undepicted non-contact bearing, for example, a vacuum preload hydrostatic bearing device. Additionally, the reticle stage RST is constituted by a reticle coarse stage and a reticle fine-moving stage. The reticle coarse stage is driven in a predetermined stroke range in a Y-axis direction, which is the scanning direction. The reticle fine-moving stage is driven, with respect to the reticle coarse stage, minutely in an X-axis direction, a Y-axis direction, and a θz direction (rotational direction about the Z-axis) by a driving mechanism formed by a voice coil motor or the like. The reticle R is held on the reticle fine-moving stage by a stationary chuck on a vacuum chuck, which are not depicted. Additionally, although not depicted, it is preferrable to provide structure whereby a reaction force that is generated by movement of the reticle coarse stage can be absorbed (i.e., prevented from causing vibration or other movement of the structure that supports the reticle stage RST) by relatively moving the moving members and the stationary members of the linear motors that drive the reticle coarse stage in mutually opposite directions with respect to the reticle base plate 24. Such an arrangement is disclosed in U.S. patent application Ser. No. 08/266,999, filed on Jun. 27, 1994.

As described above, the reticle stage RST is actually constituted by two stages; however, in order to simplify the explanation, the following explains this as one stage in which scanning and driving in the Y-axis direction, minute-rotation in the θz direction, and minute-driving in the X- and Y-axis directions are performed by the driver 26. Furthermore, the driver 26 is a mechanism that uses a linear motor, a voice coil motor, or the like as a driving source, but this is shown as a block in FIG. 11 in order to simplify the drawing.

Figure 2:
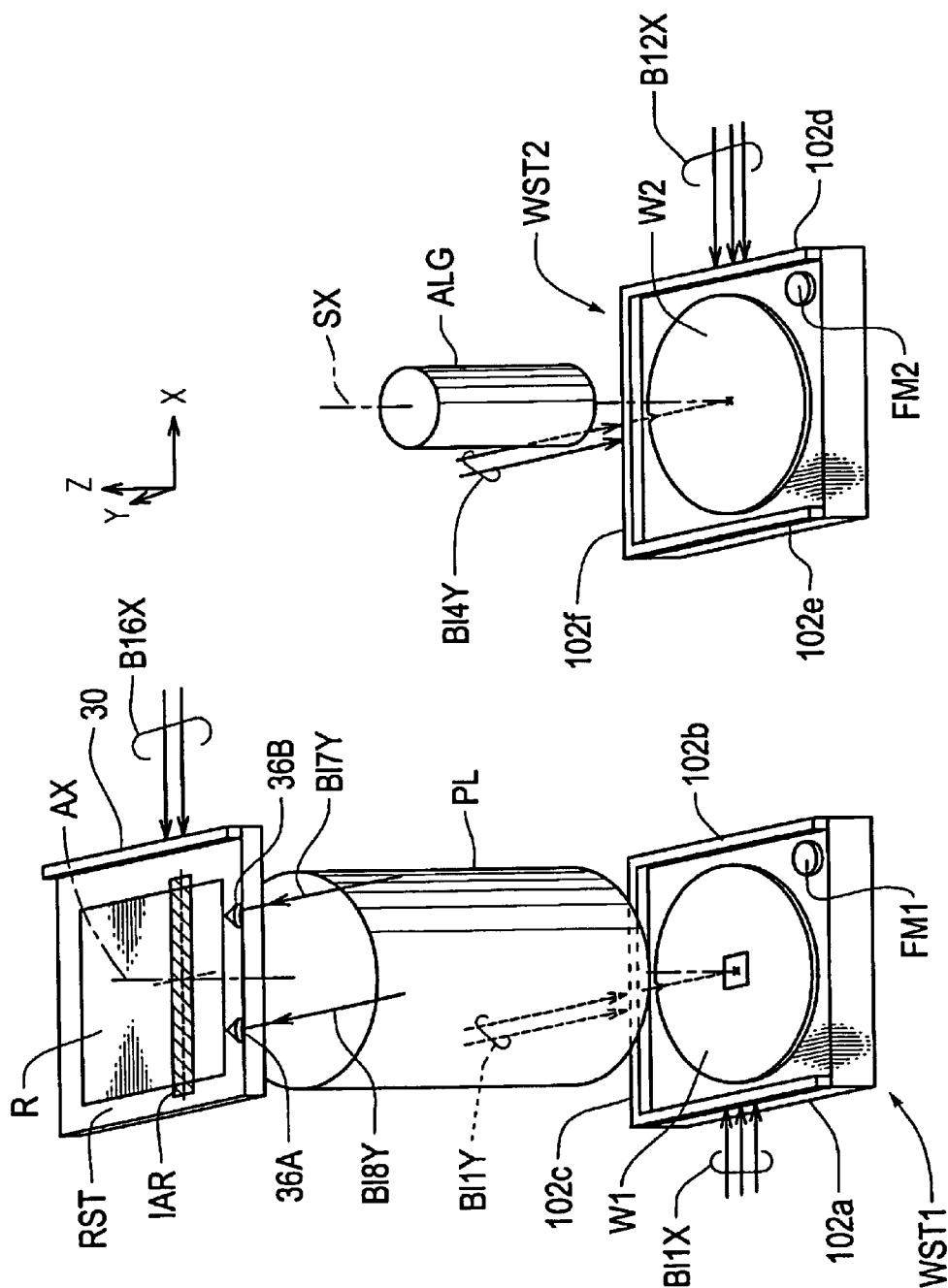
FIG. 2 is a perspective view showing a positional relationship of an alignment system, a projection optical system, a reticle stage, and two wafer stages.

As shown in FIG. 2, a parallel flat plate moving mirror 30 that is formed of the same material as the reticle stage RST (e.g., ceramic or the like) extends in the Y-axis direction and is located on one X-direction side of the reticle stage RST. A reflection surface is formed on the outward-facing side of the mirror 30 by a mirror surface process. An interferometer beam supplied from an interferometer that is part of the interferometer system 28 of FIG. 1 is irradiated toward the reflection surface of the moving mirror 30 along a measurement axis BI6X. By receiving the reflected light in the interferometer and measuring a relative displacement with respect to a reference surface, the position of the reticle stage RST is measured. The interferometer having measurement axis BI6X actually has two interferometer optical axes (parallel to each other) that can be independently measured, so as to enable the measurement of the stage position in the X-axis direction and a yawing amount (rotation about the vertical Z-axis). The interferometer with this measurement axis BI6X is used in order to rotate and control the reticle stage RST in the direction that cancels the relative rotation (rotational discrepancies) between the wafer and the reticle based on the X-axis positional information and the yawing information of the reticle stages WST1 and WST2, which is supplied from the interferometers 32 and 34 having the measurement axes BI1X and BI2X in the wafer stage side, which will be described later. Using the information from the interferometers enables the performance of X-direction synchronization control (positioning).

A pair of corner cube mirrors 36A and 36B are arranged at one side (the front side of the paper plane of FIG. 1) in the Y-axis direction of the reticle stage RST. Furthermore, interferometer beams shown by the measurement axes BI7Y and BI8Y in FIG. 2, which are supplied from a pair of double pass interferometers, not depicted, irradiate the corner cube mirrors 36A and 36B and are reflected by the cube mirrors 36A and 36B to an undepicted reflection surface arranged on the reticle base plate 24. The light then is reflected from the reflection surface on the reticle base plate 24 and returns along the same optical path so as to be received by the respective double pass interferometers, which then provide data by which to determine the relative displacement of the respective corner cubic mirrors 36A and 36B from a reference position (the reflection surface on the reticle base plate 24 at the reference position). The measurement values of the double pass interferometers are supplied to the stage controller 38 (see FIG. 11), and based on the average of their values, the position of the reticle stage RST in the Y-axis direction is measured. The information of the Y-axis direction position is used for calculation of the relative position between the reticle stage RST and the wafer stages WST1 and WST2 based on the measurement value provided by the interferometer having the measurement axis BI4Y (see FIG. 2) in the wafer side, which will be discussed later. Using the information from these interferometers, synchronization control of the wafer and the reticle in the scanning direction (Y-axis direction) is performed during scanning exposure.

Thus, in this embodiment, a reticle interferometer system 28 is constituted by a pair of double pass interferometers shown by the measurement axes BI7Y and BI8Y and an interferometer shown by the measurement axis BI6X.

Furthermore, the material used to form the glass substrate that constitutes the reticle R is selected based upon the light source to be used. For example, when a vacuum ultraviolet light source such as an $F_2$ laser light source or the like is used for a light source, fluoride crystal such as fluorite, magnesium fluoride, lithium fluoride, or the like or a quartz composition (fluorine doped quartz) or the like, having a hydroxide density that is less than 100 ppm, and containing fluorine, preferably is used. When using an ArF excimer laser light source or a KrF excimer laser light source, a quartz composition other than the above-mentioned respective substances can also be used.

In FIG. 1, the periphery of the top end portion of the lens barrel of the projection optical system PL is connected to the reticle compartment 22 without any space therebetween. In some applications, the projection optical system PL is a projection optical system in which both the object surface (reticle R) side and the image surface (wafer W) side are telecentric and is a reduction system of ¼ (or ⅕) reduction magnification. Because of this, when illumination light (ultraviolet pulse light) is irradiated from the illumination unit ILU onto the reticle R, an imaging light beam from a portion of the circuit pattern of the reticle R that has been illuminated by the ultraviolet pulse light is incident to the projection optical system PL. This imaging light beam contains a partial inverted image of the circuit pattern, has the shape of a slit (it can have a shape that is rectangular or polygonal, for example), and is imaged at a center of a visual field of the image surface side of the projection optical system PL. By this process, the projected partial inverted image of the circuit pattern is reduced and transferred to a resist layer in one shot region among a plurality of shot regions on the surface of the wafer W, which is, arranged on the imaging surface of the projection optical system PL.

When using an ArF excimer laser light source or a KrF excimer laser light source for a light source, a dioptric system formed of dioptric elements (refractive lens elements) only (i.e., reflective elements such as mirrors are not used) is preferably used for the projection optical system PL. However, in the case of using an $F_2$ laser light source, an $Ar_2$ laser light source, or the like, as disclosed in, for example, U.S. Pat. No. 5,220,454, a so-called catadioptric system that is a combination of dioptric elements and catoptric elements (reflective elements such as concave mirrors, beam splitters, or the like) or a catoptric system formed of catoptric elements only is preferably used. However, in the case of using of an $F_2$ laser light source, a dioptric system also can be used.

A catadioptric system having a beam splitter and a concave mirror as catoptric elements can also be used for a catadioptric type projection optical system as disclosed in, for example, U.S. Pat. Nos. 5,668,672 and 5,835,275 in addition to the above-mentioned disclosure. Furthermore, a catadioptric system having a concave mirror or the like can also be used without using a beam splitter as a catoptric element as disclosed in U.S. Pat. No. 5,689,337 and Japanese Laid-Open Patent Application No. 10-3039.

In addition, a catadioptric system can also be used in which a plurality of dioptric elements and two mirrors (a main mirror that is a concave mirror and a sub-mirror that is a planar mirror formed by back-coating a reflective material on a side opposite to an incident surface side of a parallel flat plate or a lens element) are arranged on the same axis and an intermediate image of a reticle pattern formed by the plurality of dioptric elements is re-imaged onto a wafer by the main mirror and the sub-mirror as disclosed in U.S. Pat. Nos. 5,031,976; 5,488,229; and 5,717,518. In this catadioptric system, the main mirror and the sub-mirror follow the plurality of dioptric elements, illumination light passes through an aperture in the main mirror and is reflected by the sub-mirror and the main mirror in order, and then passes through an aperture in the sub-mirror, and reaches the wafer.

The lens material (glass material) of the lens elements that constitute the projection optical system PL also needs to be selected based upon the light source to be used. In the case of using an ArF excimer laser light source or a KrF excimer laser light source, both quartz composition and fluorite can be used, but in the case of using a vacuum ultraviolet light source such as an $F_2$ laser light source or the like as a light source, it is preferable to use only fluorite.

In this embodiment, clean helium gas (He) or dry nitrogen gas ($N_2$) having an air (oxygen) concentration that is less than several ppm is filled within the lens barrel of the projection optical system PL.

A stage device 12, which is one aspect of the invention, will be described with reference to FIGS. 1–10.

As shown in FIG. 1, the stage device 12 is disposed within the compartment 42, which forms a wafer chamber 40 therein. The periphery of the lower end portion of the lens barrel of the projection optical system PL is connected (sealed) to the top wall of the compartment 42.

The stage device 12 is mainly constituted by a stage fixed plate 44 located within the wafer chamber 40, two wafer stages WST1 and WST2, a stage driving system and a wafer interferometer system. The two wafer stages WST1 and WST2 are floatingly supported via an undepicted vacuum preload hydrostatic bearing, which is a non-contact bearing, above the stage fixed plate 44. The wafer stages WST1 and WST2 can be two-dimensionally moved independently in the X-axis direction (right and left direction in a paper plane of FIG. 1) and in the Y-axis direction (perpendicular to a paper plane of FIG. 1). The stage driving system drives the wafer stages WST1 and WST2 two-dimensionally, as noted above. The wafer interferometer system measures a position of the wafer stages WST1 and WST2.

Figure 3:
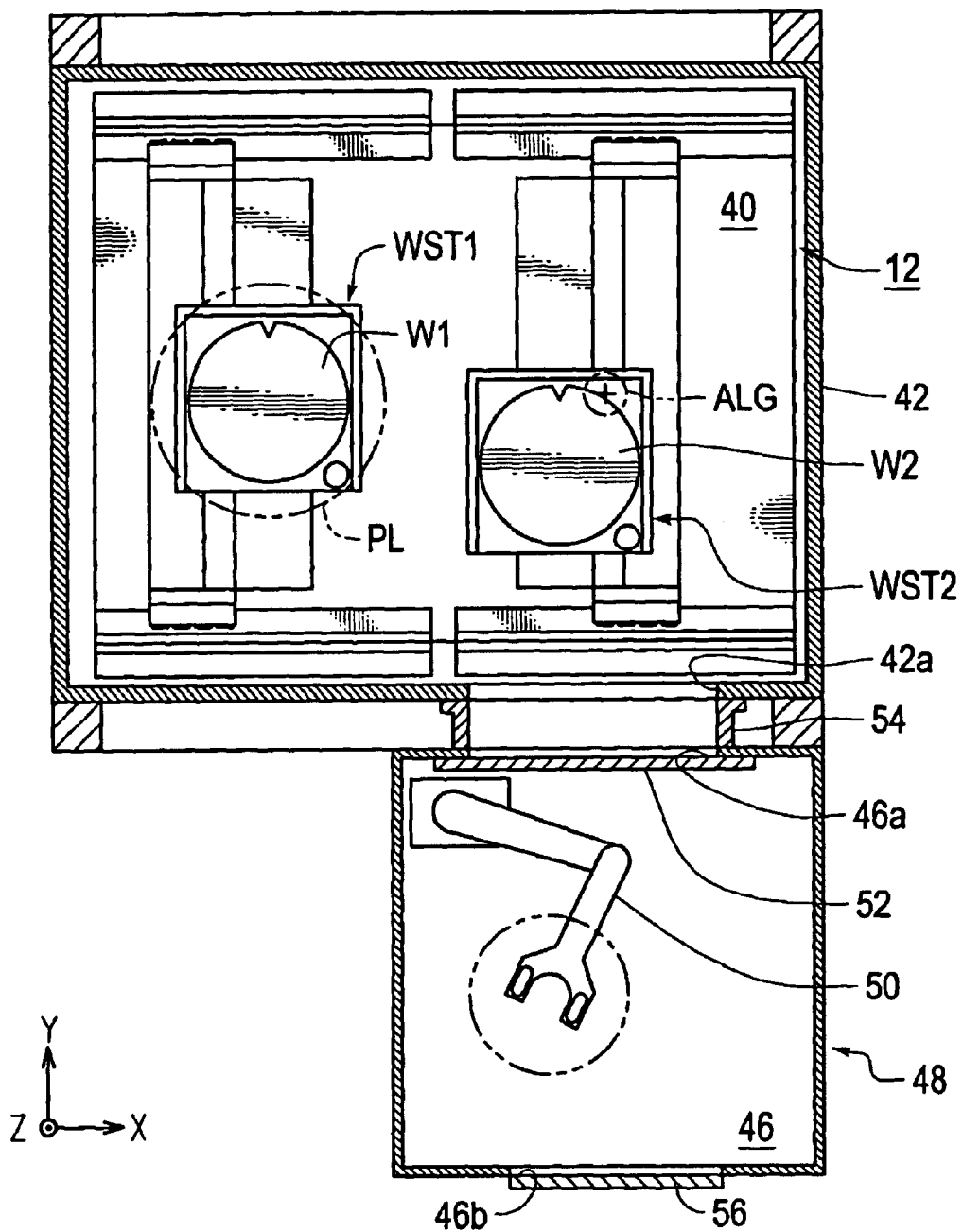
FIG. 3 is a plan view schematically showing a state in which ceiling portions have been removed from a chamber in which a stage device is housed and from a wafer loader chamber that is arranged adjacent to this chamber.

Clean helium gas (He) or dry nitrogen gas ($N_2$) having an air (oxygen) concentration that is approximately several ppm is filled within the wafer chamber 40. Furthermore, as shown in FIG. 3, a wafer loader compartment 48 having an inner loader chamber 46 is disposed adjacent to the compartment 42 that has the wafer chamber 40. In FIG. 3, compartment 48 is located at a position on a +X side of the center of the compartment 42 (right half portion in FIG. 1) and on a −Y side (front side in a paper plane of FIG. 1) of the compartment 42.

Disposed within the wafer loader chamber 46 is a wafer loader 50 that is constituted by a horizontal multi-jointed robot (learning robot). Furthermore, the sidewall on the +Y side of the wafer loader chamber 46 includes an opening portion 46a formed at a predetermined height. The opening portion 46a can be opened and closed by a sliding door 52 that is movable in an upward/downward direction (Z-axis direction).

Outside of the wafer loader chamber 46, at the opening portion 46a, is disposed a connection portion 54. Connection portion 54 connects a wafer insertion port 42a disposed in the −Y side sidewall of the compartment 42 with the opening portion 46a.

In addition, an opening portion 46b is provided in the −Y side sidewall of the wafer loader compartment 48. The opening portion 46b can be opened and closed by a door 56. Wafers can be placed into the loader compartment 48 through the opening portion 46b by an external propagation system. Although not depicted, a wafer carrier that stores a plurality of wafers is disposed within the wafer loader chamber 46. Wafer loader 50 loads wafers onto and off-of the respective wafer stages at a predetermined loading position.

Helium gas or dry nitrogen gas is filled within the wafer loader chamber 46 as well; however the purity of the helium gas or the like within the wafer loader chamber 46 may be set slightly low compared to the purity within the wafer chamber 40.

Figure 4:
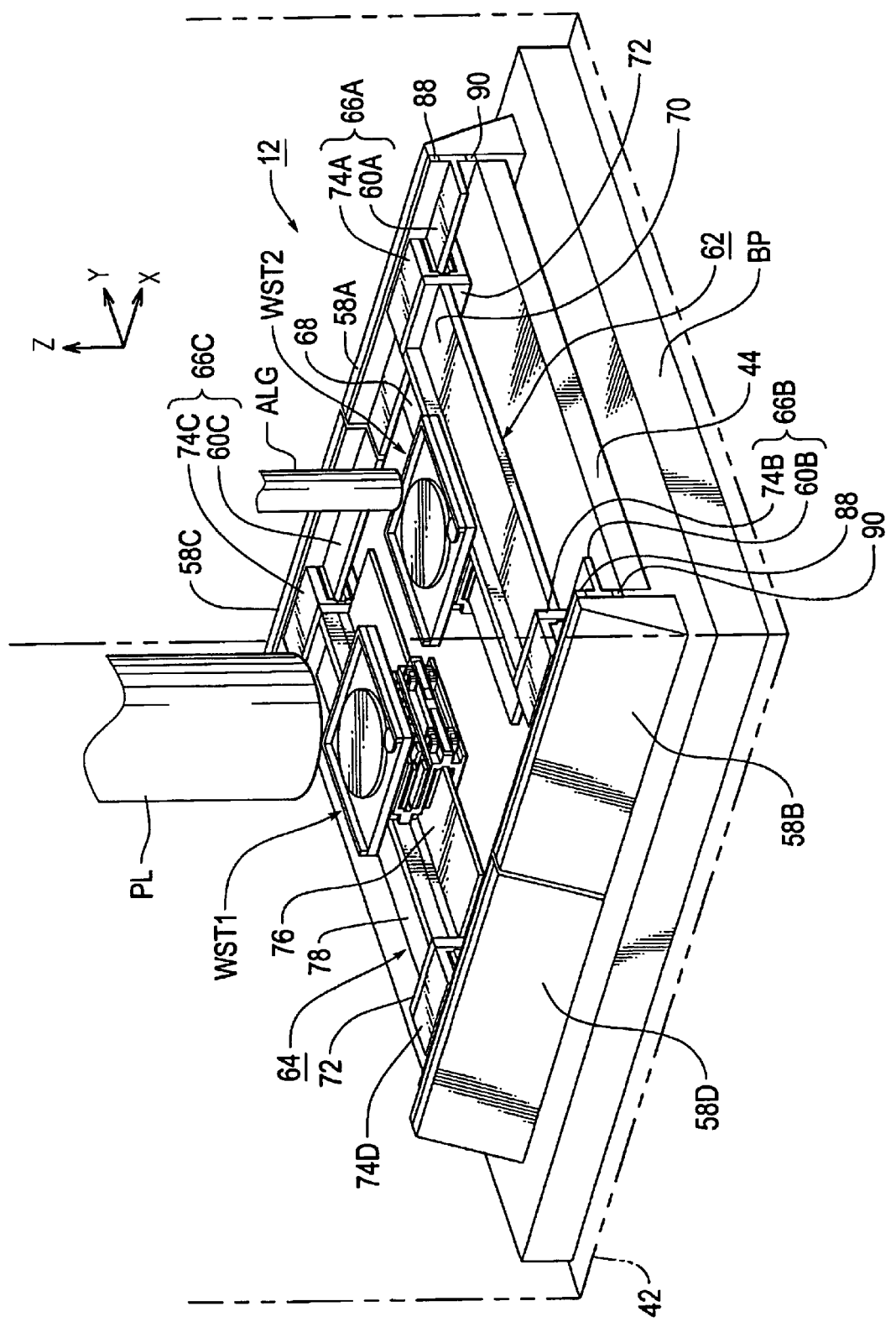
FIG. 4 is a schematic perspective view showing a stage device.

FIG. 4 shows a schematic perspective view of the stage device 12 disposed within the compartment 42. The stage device 12 is provided with a base plate BP that is horizontally arranged on an internal bottom surface of the compartment 42. A stage fixed plate 44 is supported parallel to the base plate BP at three or four points via an undepicted vibration control unit. Frames 58A, 58B, 58C and 58D function as four support members, and are arranged in pairs—first pair 58C/58D and second pair 58A/58B. That is, the two frames within each pair are spaced from each other in the Y-axis direction, while each frame extends in the X-axis direction on the base plate BP. Linear guides 60A, 60B, 60C and 60D (however, in FIG. 4, the linear guide 60D is hidden behind the frame 58D; see FIG. 5) respectively (i) extend in the X-axis direction, (ii) extend parallel to the top of the stage fixed plate 44, and (iii) are fixed on the stage fixed plate 44 internally of the respective frames 58A, 58B, 58C and 58D. A first moving body 62 (a first stationary side member) is movable in the X-direction along a pair of the linear guides 60A and 60B, which are spaced from each other in the Y-direction and that oppose each other. A second moving body 64 (a second stationary side member) is movable in the X-direction along a pair of the linear guides 60C and 60D. Wafer stages WST1 and WST2 (first and second stages) are moved in the Y-axis direction along the first and second moving bodies 62 and 64, respectively.

More particularly, the linear guides 60A and 60B are respectively fixed at the same height position relative to the top surface of the base plate BP on the internal side of the respective frames 58A and 58B, which in turn are fixed on the base plate BP as a reference. Linear guides 60A and 60B are the stationary members of a pair of X-axis linear motors 66A and 66B that constitute a first driver. Similarly, the linear guides 60C and 60D are respectively fixed at the same height position relative to the top surface of the base plate BP on the internal side of the respective frames 58C and 58D, which in turn are fixed on the base plate BP as a reference. Linear guides 60C and 60D are the stationary members of a pair of X-axis liner motors 66C and 66D that constitute a second driver. In this case, the linear guides 60A and 60B and the linear guides 60C and 60D are mutually set at the same height position, but this is not necessarily required. That is, guides 60C and 60D could have a height that is different from the height of guides 60A and 60B. Inside the linear guides 60A–60D, undepicted armature coils are arranged at a predetermined interval along the X-axis direction. Therefore, in the following explanation, the linear guides 60A–60D are called "stationary members 60A–60D".

The first moving body 62 is provided with a stationary member 68 of a Y-axis linear motor (a first stationary member). The stationary member 68 extends in the Y-axis direction. A first support frame 70, having a T-shaped cross-section, supports the stationary member 68 parallel to the top surface of the stage fixed plate 44 at a first position along the Z-axis direction. A pair of moving members 74A and 74B, each having a U-shaped cross-section, of the X-axis linear motors 66A and 66B are attached by rectangular-shaped fixing members 72 to the respective ends (in the Y-axis direction) of the support frame 70. The stationary member 68 of the Y-axis linear motor is attached to and protrudes from the −X direction side surface of the first support frame 70. The stationary member 68 is an armature unit in which many flat armature coils are arranged along the Y-axis direction.

The second moving body 64 is provided with a stationary member 76 of the Y-axis linear motor (a second stationary member). The stationary member 76 also extends in the Y-axis direction. A second support frame 78, having a T-shaped cross-section, supports the stationary member 76 parallel to the top surface of the stage fixed plate 44 at a second position along the Z-axis direction. A pair of moving members 74C and 74D, each having a U-shaped cross-section, of the X-axis linear motors 66C and 66D are attached by rectangular-shaped fixing members 72 to the respective ends (in the Y-axis direction) of the support frame 78. The stationary member 76 of the Y-axis linear motor is attached to and protrudes from the +X direction side surface of the second support frame 78. The stationary member 76 is an armature unit in which many flat armature coils are arranged along the Y-axis direction.

Figure 5:
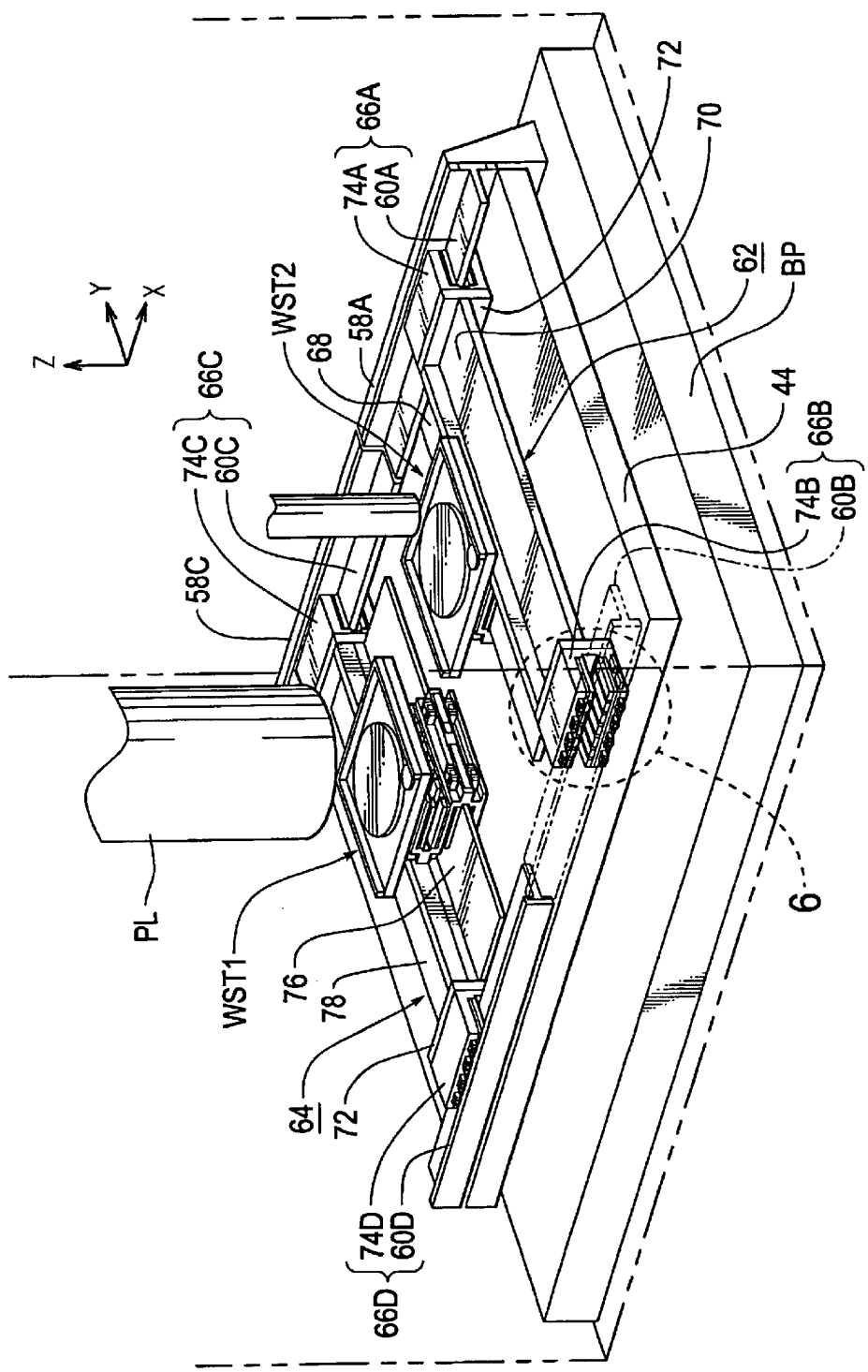
FIG. 5 is a diagram showing a state in which frames 58B and 58D and a stationary member 60B of FIG. 4 are removed.
Figure 6:
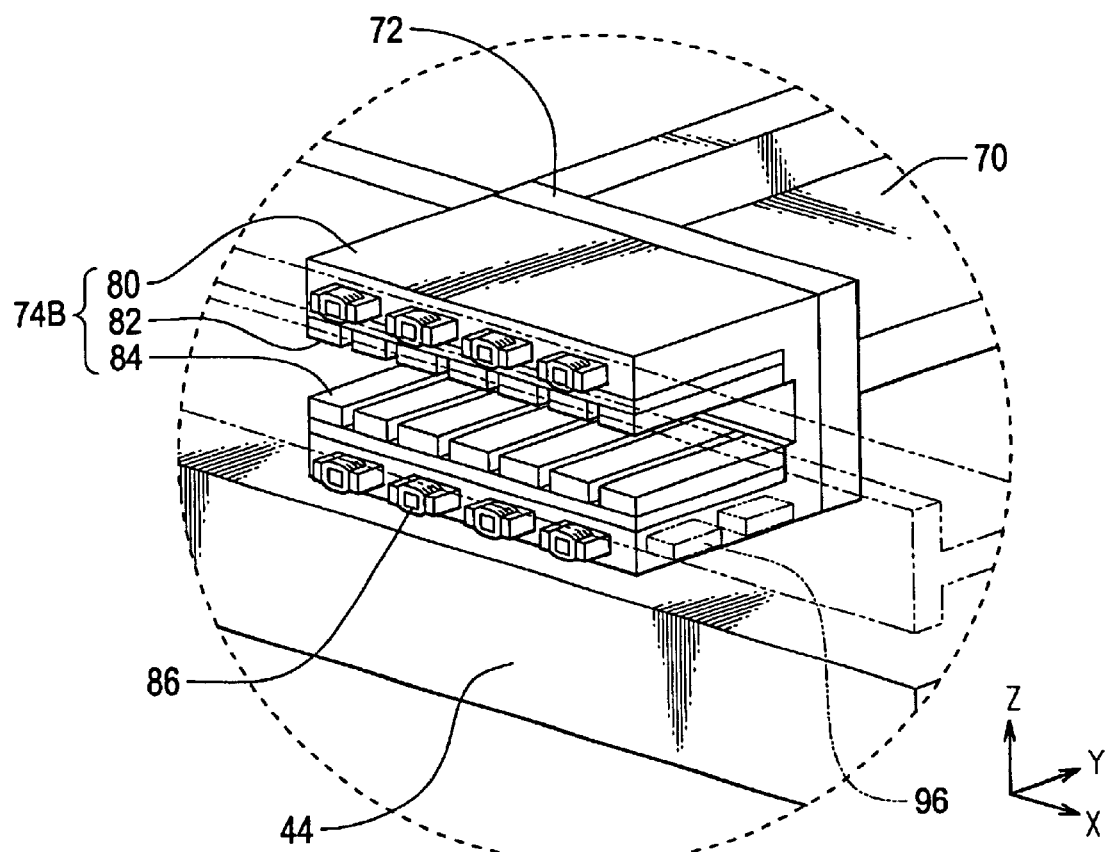
FIG. 6 is a diagram showing an enlargement of the circled portion A of FIG. 5.

FIG. 5 shows a state in which frames 58B and 58D and stationary member 60B of FIG. 4 are removed. Furthermore, FIG. 6 shows an enlarged view of the encircled area A of FIG. 5. As shown in FIG. 6, moving member 74B of one X-axis linear motor 66B is provided with a moving member yoke 80 having a U-shaped cross-section, a plurality of first field magnets 82 formed of permanent magnets, and a plurality of second field magnets 84 formed of permanent magnets. The plurality of first field magnets 82 are spaced from each other by a predetermined interval in the X-direction, as are the second field magnets 84. Additionally, the first field magnets 82 are provided on an upper portion of the yoke 80 and face downward, whereas the second field magnets 84 are provided on the lower portion of the yoke 80 and face upward. The respective first and second field magnets 82 and 84 are arranged opposite to each other. The polarity of adjacent first field magnets 82 are opposite to each other, as are the polarities of adjacent second field magnets 84. Additionally, the polarities of the first and second field magnets 82 and 84 that mutually face each other also are opposite to each other. Thus, an alternating field is generated with respect to the X-axis direction in the space between the first field magnets and the second field magnets. Thus, the moving member 74B constitutes a magnetic pole unit.

Furthermore, as shown in FIG. 6, a plurality of electromagnets 86 are respectively fixed at a predetermined interval along the X-axis direction on upper and lower surfaces (−Y side surfaces) of the moving member yoke 80 that face the frame 58B. In the side surface on the +Y side of the frame 58B, iron plates 88 and 90 extend in the X-direction. These iron plates 88 and 90 are magnetic members, and are located on portions of the frame 58B that face the electromagnets 86. Thus, as can be seen from FIG. 4, the iron plates 88 and 90 respectively are located above and below the stationary member 60B so as to sandwich the stationary member 60B.

The other moving members 74A, 74C and 74D of the X-axis linear motors 66A, 66C and 66D are structured in the same manner as described above for the moving member 74B. In addition, a plurality of electromagnets 86 are fixed at a predetermined interval along the X-axis direction in the surface of the respective yokes 80 that face each of the frames 58A, 58C, 58D. Similarly, iron plates 88 and 90 are provided above and below each of the stationary members 60A, 60C, 60D and extend in the X-direction so as to face the electromagnets 86.

In this embodiment, by providing the iron plates 88 and 90 arranged in the frames 58A and 58B, and by providing the electromagnets 86 arranged in the moving members 74A and 74B, a magnetic guide device 92 (see FIG. 11) is constituted that supports the first moving body 62 from the frames 58A and 58B via a predetermined clearance in the Y-direction. Thus, the first moving body 62 is supported without contacting the frames 58A and 58B. In the same manner, by providing the iron plates 88 and 90 arranged in the frames 58C and 58D, and by providing the electromagnets 86 arranged in the moving members 74C and 74D, a magnetic guide device 94 (see FIG. 11) is constituted that supports the second moving body 64 from the frames 58C and 58D via a predetermined clearance in the Y-axis direction. Thus, the second moving body 64 is supported without contacting the frames 58C and 58D.

The respective moving members 74A–74D are floatingly supported by a plurality of vacuum preload hydrostatic bearing devices 96 arranged in the bottom surfaces of the yokes 80. The moving members 74A–74D are floatingly supported above the stage fixed plate 44 with a clearance of approximately several microns. In this case, by providing the vacuum preload hydrostatic bearing devices 96 arranged in the bottom surfaces of the moving members 74A and 74B, a third-axis direction non-contact support mechanism is provided that supports the first moving body 62 with respect to the Z-axis direction (third-axis direction) in a non-contact manner. Similarly, by providing the vacuum preload hydrostatic bearing devices 96 arranged in the bottom surfaces of the moving members 74C and 74D, a third-axis direction non-contact support mechanism is provided that supports the second moving body 64 with respect to the Z-axis direction (third-axis direction) in a non-contact manner.

Figure 7A:
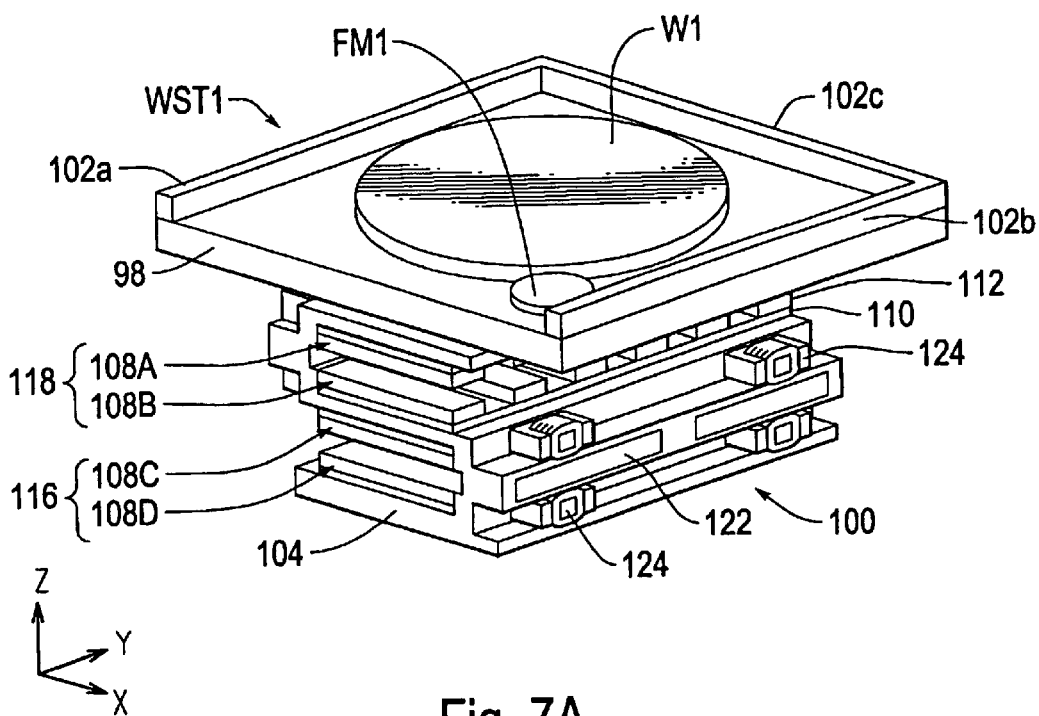
FIG. 7A is a perspective view in which a first wafer stage is seen from a diagonal upper direction.
Figure 7B:
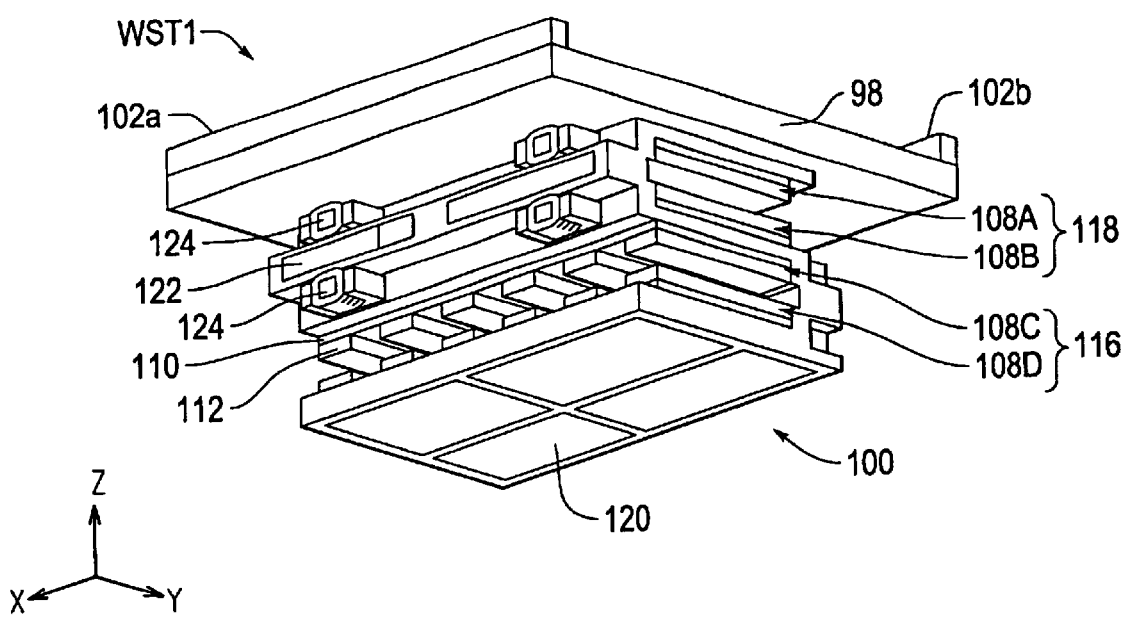
FIG. 7B is a perspective view in which the first wafer stage is seen from a diagonal lower direction.

FIGS. 7A and 7B show a top surface side perspective view and a bottom surface side perspective view of the first wafer stage WST1. As shown in these figures, the wafer stage WST1 is provided with a substrate table 98 that holds a wafer W1 and a stage main body 100, which is a first moving element that supports the substrate table 98 via a Z-tilt driving mechanism that will be described later.

A pair of X moving mirrors 102a and 102b are provided on the substrate table 98, and extend in the Y-axis direction at both X-axis ends of the table 98. In addition, a Y moving mirror 102c is provided on the substrate table 98, and extends in the X-axis direction at one Y-axis end of the substrate table 98. The wafer W1 is fixed to the upper surface of the substrate table 98 by vacuum absorption or mechanical holding by an undepicted wafer holder. Also provided on the substrate table 98 is a reference mark plate FM1 having a surface that is arranged at substantially the same height as the height at which the wafer W1 is fixed. Various wafer alignment marks, which will be discussed later, are formed in the reference mark plate FM1. The reference mark plate FM1 is used, for example, when the reference position of the wafer stage WST1 is detected.

The stage main body 100 includes: (i) a main body member 104 that is formed of a non-magnetic body having a substantially S-shaped cross-section, (ii) a pair of magnetic pole units 108A and 108B that face each other and are arranged in an upper half of the S-shaped main body member 104, and (iii) a pair of magnetic pole units 108C and 108D that face each other and are arranged in a lower half of the S-shaped main body member 104. Each of the magnetic pole units 108A, 108B, 108C and 108D are constituted by magnetic body members 110 fixed in the main body member 104 and field magnets 112 arranged on the magnetic body members 110 and spaced from each other by a predetermined interval in the Y-axis direction. Adjacent field magnets 112 have opposite polarities. Similarly, field magnets 112 that face each other have opposite polarities. Therefore, an alternating field is formed with respect to the Y-axis direction in the space between the mutually facing magnetic pole units 108A and 108B and in the space between the magnetic pole units 108C and 108D.

In this embodiment, a Lorentz force (electromagnetic force or thrust) is generated in the Y-axis direction by the electromagnetic interaction between the stationary member 76 and a moving member 116, which is constituted by the pair of magnet pole units 108C and 108D in the lower half of the main body member 104. Thus, a first Y-axis linear motor 114A is constituted by the moving member 116 and the stationary member 76 (see FIG. 8). In the same manner, a Lorentz force is generated in the Y-direction by the electromagnetic interaction between the stationary member 68 and a moving member 118, which is constituted by the pair of magnetic pole units 108A and 108B in the upper half of the main body member 104. Thus, a second Y-axis linear motor 114B (see FIG. 11) is constituted by the moving member 118 and the stationary member 68.

In this embodiment, as can be appreciated from FIGS. 7A, 7B and 8, due to the shape of the stage main body 100, the Y-axis direction thrust for the wafer stage WST1 is applied through the center of gravity of the wafer stage WST1 (or in a vertical plane containing the point of the center of gravity, either above or below the point of the center of gravity). Because of this, when the wafer stage WST1 is driven in the Y-axis direction by the Y-axis linear motors 114A and 114B, θz rotation (yawing) is not generated in the wafer stage WST1. This also is true for the second wafer stage WST2.

Additionally, as shown in FIG. 7B, a plurality of (four) vacuum preload hydrostatic bearing devices 120, which are non-contact bearings, are arranged in the bottom surface of the stage main body 100. Therefore, the wafer stage WST1 is non-contactingly supported with approximately several microns of clearance above the moving surface, which is the top surface of the stage fixed plate 44, due to the balance between a vacuum absorption force and the weight of the entire wafer stage WST1 and a hydrostatic pressure of pressurized gas (e.g., helium or nitrogen gas, or the like) emitted from the bearing surfaces of the vacuum preload hydrostatic bearing devices 120. Thus, a third-axis direction non-contact mechanism by which the wafer stage WST1 (a first stage) is non-contactingly supported (i.e., a predetermined clearance is maintained) in the Z-axis direction with respect to the moving surface is constituted by the vacuum preload hydrostatic bearing devices 120.

As seen from FIGS. 7A and 7B, the external surface of both X-axis direction sidewalls of the main body member 104 also includes vacuum preload hydrostatic bearing devices 122 located at the center of those sidewalls with respect to the Z-axis direction, and electromagnets 124. The external surface of the +X direction sidewall of the main body member 104 includes a convex portion, as shown in FIG. 7A. A plurality of the vacuum preload hydrostatic bearing devices 122 are arranged in this convex portion with a predetermined interval in the Y-axis direction therebetween. Furthermore, four of the electromagnets 124 are arranged on that sidewall, with one electromagnet 124 located above and one electromagnet located below each of the vacuum preload hydrostatic bearing devices 122. In the same manner, as shown in FIG. 7B, the external surface of the −X direction sidewall of the main body member 104 includes a convex portion, and the vacuum preload hydrostatic bearing devices 122 are arranged in this convex portion with a predetermined interval in the Y-axis direction therebetween. Furthermore, four electromagnets 124 are arranged on that sidewall, with one electromagnet 124 located above and one electromagnet located below each of the vacuum preload hydrostatic bearing devices 122. As can be appreciated from the above explanation, the stage main body 100 has a right-left symmetrical structure with respect to the X- and Y-axis directions.

Figure 8:
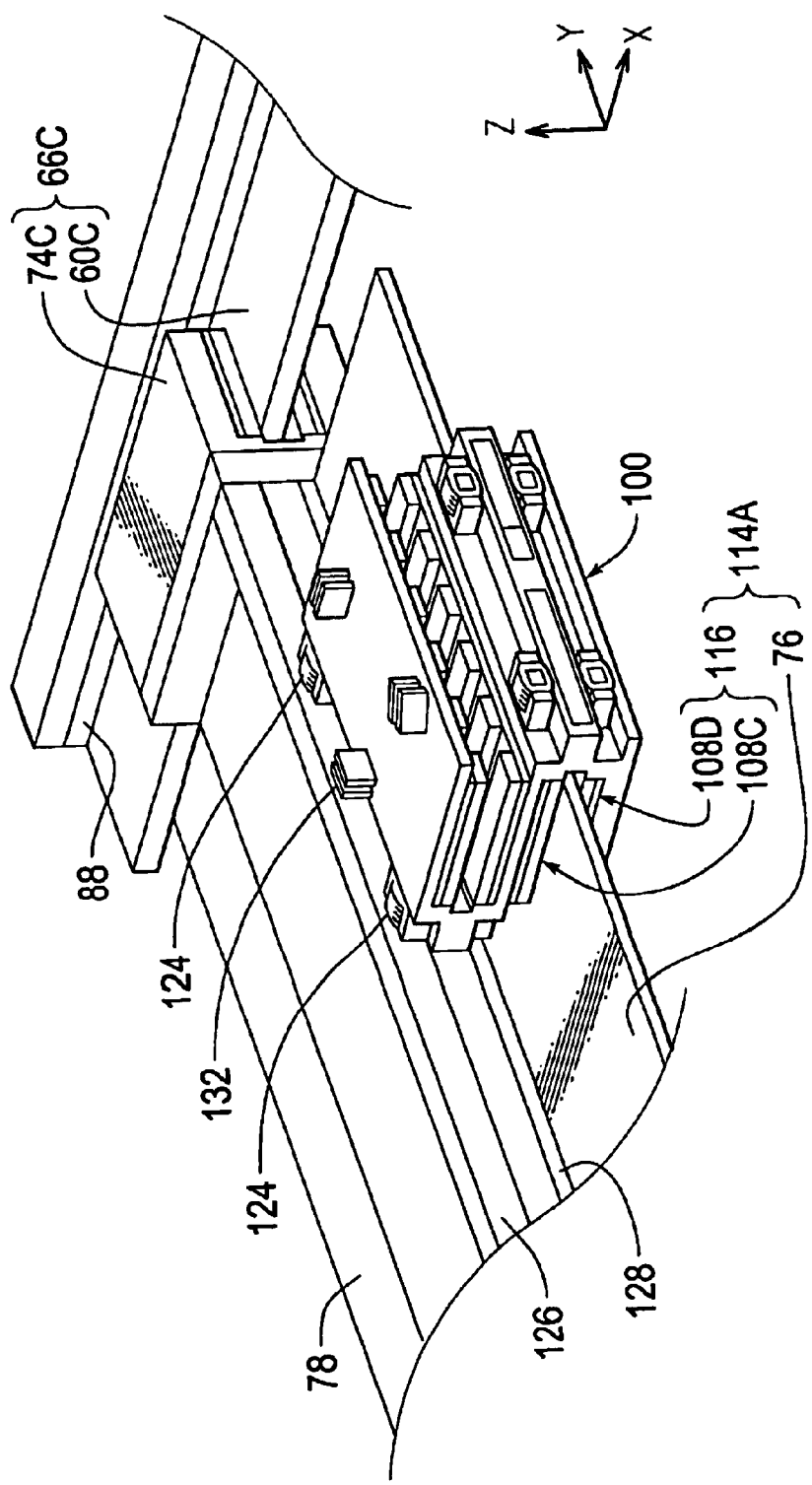
FIG. 8 is a diagram showing a stationary member and a wafer stage in a state in which a substrate table is removed from the wafer stage in order to explain a structure of a stage main body that composes a wafer stage.

FIG. 8 shows a state in which the stage main body 100 that constitutes the wafer stage WST1 is positioned at a location where it can be driven by the Y-axis driving linear motor 114A formed of the stationary member 76 and the moving member 116. In FIG. 8, the second support frame 78 facing the four electromagnets 124 on the −X side includes iron plates 126 and 128, which are magnetic body members that are extended in the Y-axis direction. Therefore, the stage main body 100 (wafer stage WST1) can be non-contactingly supported with a predetermined clearance in the X-axis direction with respect to the support frame 78, due to the balance between the magnetic attraction (magnetic force) by which the electromagnets 124 attract the iron plates 126 and 128 and a hydrostatic pressure of pressurized gas (e.g., helium or nitrogen gas, or the like) emitted from the bearing surfaces of the vacuum preload hydrostatic bearing devices 122.

Figure 9A:
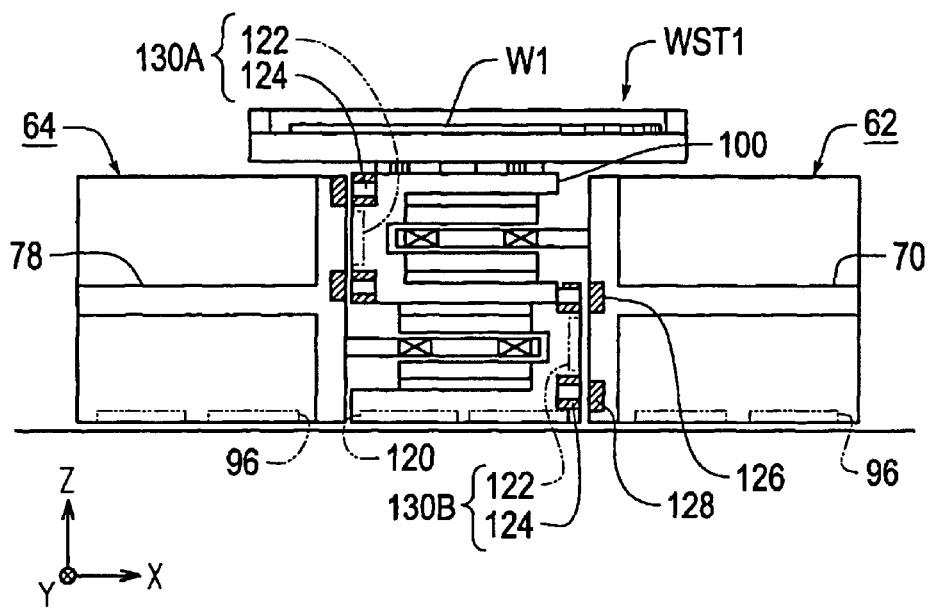
FIGS. 9A and 9B are diagrams that explain a wafer stage replacement operation.
Figure 9B:
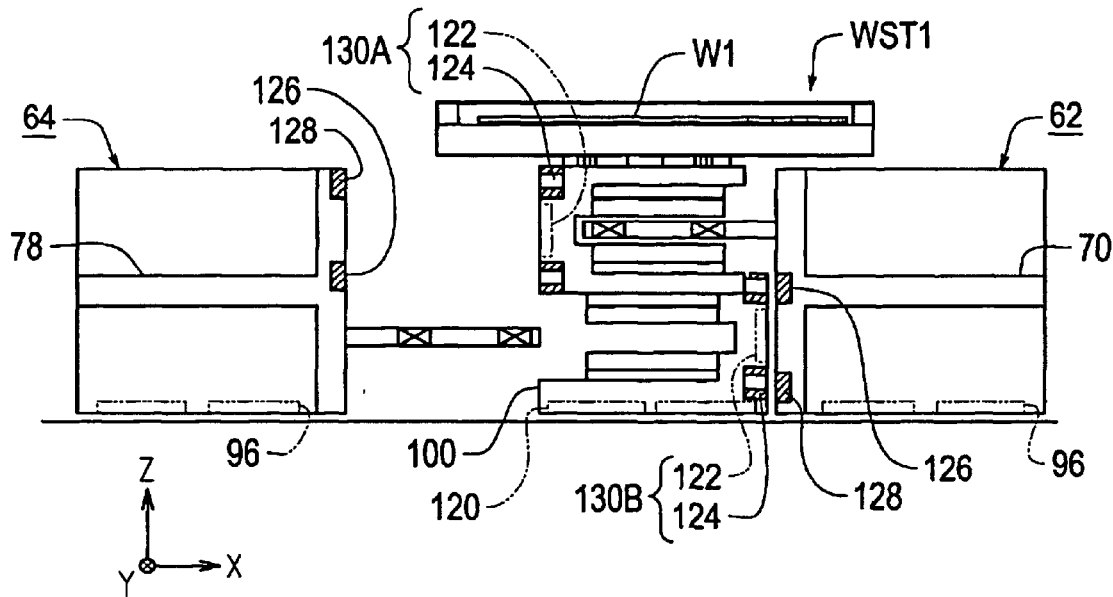

FIG. 9A schematically shows a state immediately before the wafer stage WST1 is replaced from the first moving body 62 side to the second moving body 64 side. In FIG. 9A, the first support frame 70 facing the four electromagnets 124 on the +X side includes the iron plates 126 and 128, which are magnetic body members that extend in the Y-axis direction. Therefore, the wafer stage WST1 is non-contactingly supported with a predetermined clearance in the X-axis direction with respect to the support frame 70, due to the balance between the magnetic attraction (magnetic force) by which the electromagnets 124 attract the iron plates 126 and 128 and a hydrostatic pressure of pressurized gas (e.g., helium or nitrogen gas, or the like) emitted from the bearing surfaces of the vacuum preload hydrostatic bearing devices 122.

In addition, as shown in FIG. 9A, by the two vacuum preload hydrostatic bearing devices 122 and the four electromagnets 124 arranged in the −X side of the stage main body 100, an X-axis direction support mechanism 130A is constituted by which the wafer stage WST1 is non-contactingly supported in the X-axis direction (second direction) with respect to the second support frame 78. In the same manner, as described above, by the two vacuum preload hydrostatic bearing devices 122 and the four electromagnets 124 arranged in the +X side of the stage main body 100, an X-axis direction support mechanism 130B is constituted by which the wafer stage WST1 is non-contactingly supported in the X-axis direction (second direction) with respect to the first support frame 70. The magnetic force (and the amount of pressurized gas that is emitted by the vacuum preload hydrostatic bearing devices 122) generated by the respective electromagnets 124 constituting the X-axis direction support mechanisms 130A and 130B is controlled by a stage controller 38, which will be discussed later (see FIG. 11). Thus, by the stage controller 38, a support force of the X-axis direction support mechanisms 130A and 130B can be controlled. In this manner, the X-direction interval can be adjusted between the stage main body 100 and the first moving body 62, and between the stage main body 100 and the second moving body 64. Thus, an adjusting device is constituted by the X-axis direction support mechanisms 130A and 130B.

Furthermore, as can be ascertained from FIGS. 7A and 7B, in the surfaces of the +X side and the −X side of the stage main body 100, two sets of the vacuum preload hydrostatic bearing device 122 and the electromagnet 124 are arranged in two different locations with respect to the Y-axis direction. Therefore, the wafer stage WST1 is non-contactingly supported with respect to the first and second support frames 70 and 78 in two different locations in the Y-axis direction. Therefore, in the stage controller 38, by adjusting a support force at the respective support points (i.e., at the positions of the electromagnets 124 and the vacuum preload hydrostatic bearing devices 122), θz rotation amount (yawing amount) of the wafer stage WST1 can be controlled.

As shown in FIG. 8, on the top surface of the stage main body 100, three stationary members 132 of voice coil motors are fixed substantially at the vertex positions of an equilateral triangle. Three moving members (not depicted) of the voice coil motors are respectively arranged (one moving member for each of the stationary members 132) at the bottom surface of the substrate table 98. The three voice coil motors constitute a Z-tilt driving mechanism 134A (see FIG. 11) by which the substrate table 98 is slightly driven with respect to three degrees-of-freedom directions, i.e., in the Z-axis direction, the θx direction (rotation direction about the X-axis), and the θy direction (rotation direction about the X-axis).

The second wafer stage WST2 is structured in the same manner as the first wafer stage WST1. Therefore, an X-axis direction support mechanism 130C that functions as an adjusting device that non-contactingly supports the wafer stage WST2 in the X-axis direction (second direction) with respect to the second support frame 78, and an X-axis direction support mechanism 130D that functions as an adjusting device that non-contactingly supports the wafer stage WST2 in the X-axis direction (second direction) with respect to the first support frame 70 (see FIG. 11) are provided for the wafer stage WST2. The X-axis direction support mechanisms 130C and 130D are constituted in the same manner as the X-axis direction support mechanisms 130A and 130B.

Additionally, a Z•tilt driving mechanism 134B (see FIG. 11) by which the substrate table 98 holding the wafer W2 is slightly driven with respect to three degrees-of-freedom directions, i.e., in the Z-axis direction, the θx direction, and the θy direction also is provided on the stage main body 100 of the second wafer stage WST2.

Furthermore, as shown in FIG. 2, a pair of X moving mirrors 102d and 102e, a Y moving mirror 102f and a reference mark plate FM2 are fixed on the wafer stage WST2 (i.e., on the top surface of the substrate table 98 of the wafer stage WST2).

The external surface sides of the respective moving mirrors 102a–102f arranged on the wafer stages WST1 and WST2 (more precisely, on the substrate tables 98 of those wafer stages) are reflection surfaces on which mirror finishing has been performed. As shown in FIG. 2, interferometer beams of the respective measurement axes that constitute an interferometer system, which will be discussed later, are projected onto these reflection surfaces, and by receiving the reflected light in the interferometers, displacement from a reference position (in general, a fixed mirror is arranged in a projection optical system side surface and an alignment optical system side surface, and this is considered as a reference surface) is measured. In this manner, the two-dimensional position of the wafer stages WST1 and WST2 can be respectively measured. The structure of the measurement axes of the interferometer system is described in detail later.

In FIG. 1, an off-axis type alignment optical system ALG is arranged at a position separated from an optical axis center AX of the projection optical system PL on the +X side by a predetermined distance. This alignment optical system ALG has three types of alignment sensors: an LSA (Laser Step Alignment) system, an FIA (Field Image Alignment) system, and an LIA (Laser Interferometric Alignment) system, and can perform positional measurement of the alignment mark on the wafer and of the reference mark on the reference mark plate in two-dimensional X-Y directions.

The LSA system is a sensor that can be most widely used in which a laser light is irradiated onto a mark, the diffracted and dispersed light is used, and the mark position is measured, and is conventionally used for a variety of wafer processes. The FIA system is a sensor in which a mark is illuminated by a broad band light such as a halogen lamp or the like, the mark image is image-processed, and the mark position is measured, and is effectively used with a non-symmetrical mark in a wafer surface and in an aluminum layer. The LIA system is a sensor in which a laser light with slightly changed frequency is irradiated from two directions into a diffraction grid-shaped mark, two generated diffracted lights are interfered with each other, and the mark positional information is detected from the phase, and is effectively used with a low gap and a wafer having a rough surface.

In this embodiment, these three types of alignment sensors are appropriately used depending on necessity, whereby so-called search alignment in which three one-dimensional mark positions on the wafer are detected, wafer schematic positional measurement, and fine alignment in which accurate position measurement for the respective shot regions on the wafer, or the like, are performed.

Information from the respective alignment sensors that constitute this alignment optical system ALG is A/D converted by an alignment controller 136 (see FIG. 11), a digitized waveform signal is calculated and processed, and a mark position is detected. This result is sent to the main controller 16, and in response to the result, a synchronization positional change or the like during exposure is instructed from the main controller 16 to the stage controller 38.

Furthermore, although not depicted in FIG. 1, on the reticle stage in the exposure apparatus 10 of this embodiment, a pair of reticle alignment microscopes 138A and 138B (see FIG. 11) are arranged that are formed of a TTR (Through The Reticle) alignment optical system. Such a system uses an exposure wavelength that simultaneously observes the mark on the reference mark plates FM1 or FM2 with a reticle mark (not depicted) on the reticle R via the projection optical system PL. The detection signals of the reticle alignment microscopes 138A and 138B are supplied to the main controller 16 via the alignment controller 136.

Furthermore, although not depicted in FIG. 1, auto focus/auto leveling measurement mechanisms (hereafter referred to as "AF/AL system") that check a focus position are respectively arranged in the projection optical system and the alignment optical system ALG.

For example, Japanese Laid-Open Patent Application No. 10-214783 discloses a structure of an exposure apparatus in which auto focus/auto leveling measurement mechanisms are arranged in the projection optical system PL and in the alignment optical system ALG, respectively. Since such systems are well known, no further explanation is provided.

Therefore, in this embodiment, in the same manner as the exposure apparatus disclosed in the above-mentioned Japanese Laid-Open Patent Application No. 10-214783, during the measurement by the alignment sensor of the alignment optical system ALG, measurement of the AF/AL system in the same manner as during exposure and auto focus/auto leveling control are performed, and positional measurement of alignment marks is performed, so alignment measurement with high accuracy is possible. In other words, off set (discrepancy) is not generated due to a change in the stage posture between the performance of exposure and the performance of alignment.

An interferometer system 140 (see FIG. 11) that controls a position of the wafer stages WST1 and WST2 will be explained with reference to FIGS. 1, 2, and 10.

Figure 10:
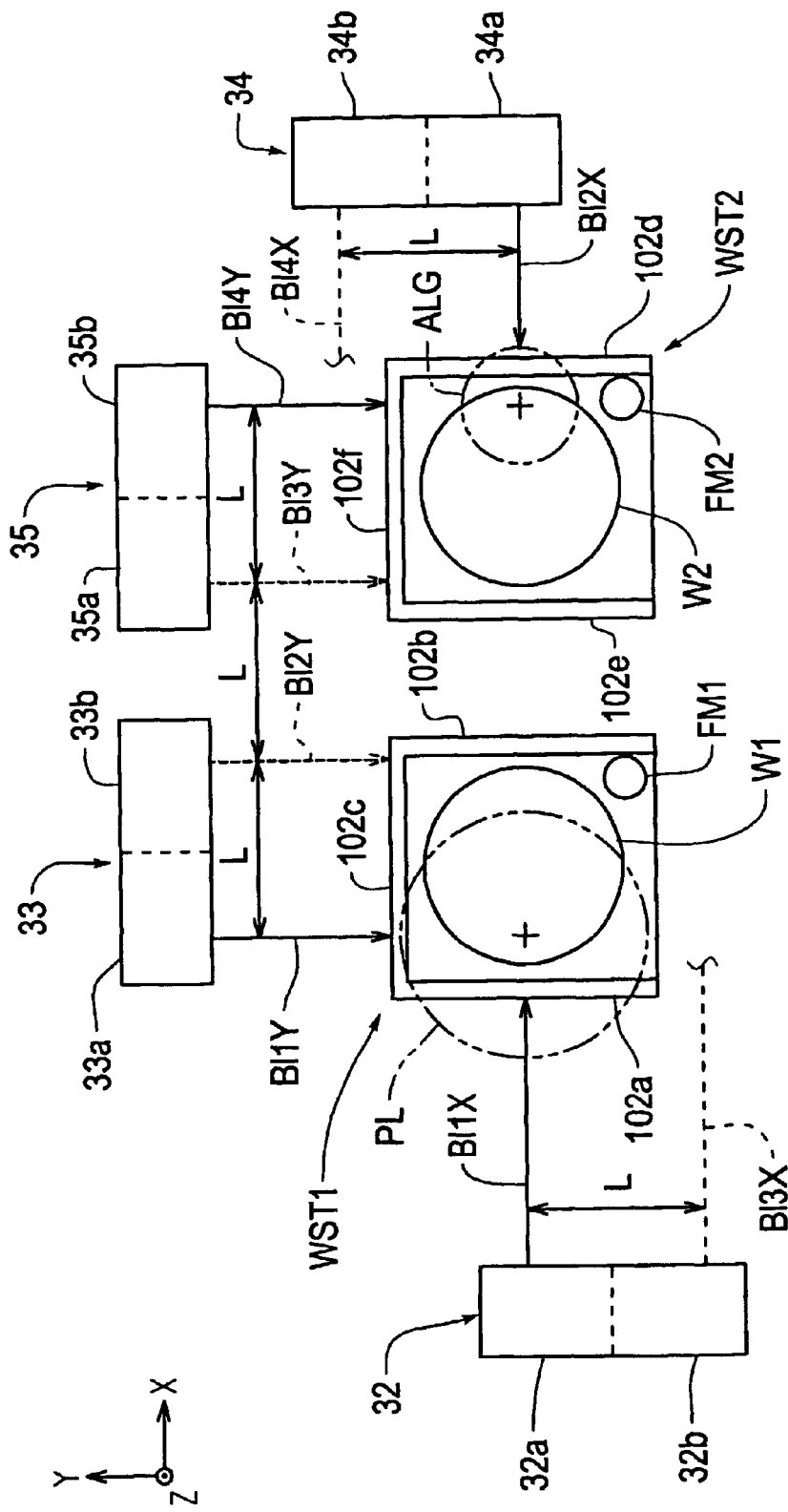
FIG. 10 is a plan view explaining a structure of an interferometer system for the wafer side of the exposure apparatus.

As shown in FIG. 10, the interferometer system 140 is constituted by two X-axis interferometer sub-systems 32 and 34 and two Y-axis interferometer sub-systems 33 and 35. Among these sub-systems, one X-axis interferometer sub-system 32 is arranged at a position separated from the projection optical system PL (see FIG. 1) on the −X side by a predetermined distance. The other X-axis interferometer sub-system 34 is arranged at a position separated from the alignment optical system ALG (see FIG. 1) in the +X direction by a predetermined distance. The arrangement positions of the respective X-axis interferometer sub-systems 32 and 34 is slightly shifted with respect to the Y-axis direction.

The Y-axis interferometer sub-systems 33 and 35 are aligned and arranged on substantially the same position relative to the X axis at positions separated from the projection optical system PL and the alignment optical system ALG, respectively, on the −Y side by a predetermined distance. The interferometer sub-systems 32–35 are supported in a suspended state by an undepicted support member that supports the alignment optical system ALG or the like arranged within the compartment 42.

As shown in FIG. 10, the X-axis interferometer sub-system 32 is provided with an interferometer 32a and an interferometer 32b. The interferometer 32a has a measurement axis BI1X in the X-axis direction that passes through the detection center (the optical axis SX) of the alignment optical system ALG and through the projection center of the projection optical system PL. The interferometer 32b has a measurement axis BI3X in the X-axis direction that passes through a position separated from the measurement axis BI1X on the −Y side by a predetermined distance L. The X-axis interferometer sub-system 34 is provided with an interferometer 34a and an interferometer 34b. The interferometer 34a has a measurement axis BI2X in the X-axis direction that passes through the projection center of the projection optical system PL and through the detection center of the alignment optical system ALG. The interferometer 34b has a measurement axis BI4X in the X-axis direction that passes through a position separated from the measurement axis BI2X on the +Y side by a predetermined distance L. The interferometers 32a and 32b emit interferometer beams in the +X direction, and the interferometers 34a and 34b emit interferometer beams in the −X direction.

The Y-axis interferometer system 33 is provided with an interferometer 33a and an interferometer 33b. The interferometer 33a has a measurement axis BI1Y in the Y-axis direction that crosses perpendicular to the measurement axes BI1X and BI2X and extends through the projection center of the projection optical system PL. The interferometer 33b has a measurement axis BI2Y in the Y-axis direction separated from the measurement axis BI1Y by a distance L on the +X side. The Y-axis interferometer system 35 is provided with an interferometer 35a and an interferometer 35b. The interferometer 35a has a measurement axis BI3Y in the Y-axis direction that passes through a position separated from the measurement axis BI2Y by a distance L on the +X side. The interferometer 35b has a measurement axis BI4Y that crosses perpendicular to the measurement axes BI4X and BI2X, passes through the detection center of the alignment optical system ALG, and is separated by a distance L in the +X side from the measurement axis BI3Y. The interferometers 33a, 33b, 35a and 35b emit interferometer beams in the −Y direction.

FIG. 2 shows that alignment is performed with respect to the wafer W2 on the wafer stage WST2 when exposure is simultaneously performed with respect to the wafer W1 on the wafer stage WST1. At this time, an interferometer beam that passes through the projection center (i.e., the optical axis AX) of the projection optical system PL shown by the measurement axis BI1X from the interferometer 32a is irradiated to an X moving mirror 102a on the wafer stage WST1. In the same manner, an interferometer beam that passes through the detection center (i.e., the optical axis SX) of the alignment optical system PL shown by the measurement axis BI2X from the interferometer 34a is irradiated to the X moving mirror 102d on the wafer stage WST2. Furthermore, by receiving the reflected light beams in the interferometers 32a and 34a, the relative displacement from the reference position of the respective moving mirrors is measured, and the X-axis direction position of the wafer stages WST1 and WST2 is measured. In actuality, as shown in FIG. 2, the interferometers 32a and 34a are three-axes interferometers having three optical axes, and therefore tilt measurement and yawing amount (θz rotation) measurement are possible in addition to the measurement of the X-axis direction position of the wafer stages WST1 and WST2. The output values of the respective optical axes can be independently measured.

Additionally, in FIG. 2, an interferometer beam that passes through the projection center (i.e., the optical axis AX) of the projection optical system PL shown by the measurement axis BI1Y from the interferometer 33a is irradiated to the Y moving mirror 102c on the wafer stage WST1. An interferometer beam that passes through the detection center (i.e., the optical axis SX) of the alignment optical system ALG shown by the measurement axis BI4Y from the interferometer 35b is irradiated to the Y moving mirror 102f on the wafer stage WST2. Furthermore, by receiving the reflected light beams in the interferometers 33a and 35b, the relative displacement from the reference position of the respective moving mirrors is measured, and the Y-axis direction position of the wafer stages WST1 and WST2 is measured. In actuality, the interferometers 33a and 35b having the measurement axes BI1Y and BI4Y are two-axis interferometers having two optical axes, and therefore tilt measurement is possible in addition to the measurement in the Y-axis direction of the wafer stages WST1 and WST2. The output values of the respective optical axes can be independently measured.

As discussed later, in the exposure apparatus 10 of this embodiment, the wafer stage WST1 can be replaced with the wafer stage WST2 (i.e., wafer stage WST2 can replace wafer stage WST1 beneath the projection optical system PL). However, even after this replacement is performed, in the same manner as described above, the position of the wafer stage WST2 on which exposure is performed is measured by the interferometers 32a and 33a having the measurement axes BI1X and BI1Y, respectively. The position of the wafer stage WST1 on which alignment is performed is measured by the interferometers 34a and 35b having the measurement axes BI2X and BI4Y, respectively.

Therefore, in this embodiment, during exposure and alignment, position measurement of the wafer stages WST1 and WST2 in a state without a so-called Abbe's number can be accurately performed.

The remainder of the interferometers 32b, 33b, 35a and 34b are not used during either exposure or alignment, but rather are used during replacement of the wafer stages. A method of using these interferometers will be explained in a flow of simultaneous parallel processing in the wafer stages WST1 and WST2, that will be discussed later.

The measurement values of the respective interferometers of the respective interferometer sub-systems 32–35 that constitute the above-mentioned interferometer system 140 are supplied to the stage controller 38 and to the main controller 16 via the stage controller 38. In the stage controller 38, in response to instructions from the main controller 16, movement of the wafer stages WST1 and WST2 is controlled.

FIG. 11 shows a main structure of a control system of the exposure apparatus 10 for this embodiment. The main components of the control system are the main controller 16, which performs overall control of the entire device, the stage controller 38, which is instructed by the main controller 16, an alignment controller 136, and the like. A step-and-scan exposure operation will be explained for the exposure apparatus 10 of this embodiment.

First, in the stage controller 38, in response to an instruction that is given based on the alignment result from the main controller 16, the measurement values of the interferometer 33a having the measurement axis BI1Y and the interferometer 32a having the measurement axis BI1X are monitored. While performing this monitoring, the X-axis linear motors 66C and 66D and the Y-axis linear motor 114A constituting the driving system of the wafer stage are controlled, and the wafer stage WST1 (or WST2) is moved to a scanning start position for exposure of the first shot region of the wafer W1 (or W2).

Next, in the stage controller 38, in response to the instruction of the main controller 16, when relative scanning in the Y-axis direction of the reticle R and the wafer W1 (or W2), that is, the reticle stage RST and the wafer stage WST1 (or WST2) begins, both stages RST and WST1 (or WST2) reach their target scanning speed and reach a synchronized state, a pattern region of the reticle R begins to be illuminated by an ultraviolet pulse light beam from the illumination system unit ILU, and scanning exposure begins. The relative scanning is performed by controlling the reticle driver 26, and the linear motors 114A, 66C, and 66D that constitute the wafer stage driving system, while the stage controller 38 monitors the measurement values of the measurement axis BI6X and the measurement axes BI7Y and BI8Y of the reticle interferometer system and the measurement axes BI1X and BI1Y of the interferometer system 140.

Prior to the start of scanning exposure, when both stages reach their target scanning speed, in the main controller 16, pulse light emitting is started by giving an instruction to a laser controller 18. Movement of a blade of a movable reticle blind located within the illumination unit FLU is performed by an undepicted blind driving device, which is synchronized and controlled with movement of the reticle stage RST by the stage controller 38. Accordingly, the irradiation of the ultraviolet pulse light beam is shielded from areas outside of the pattern region on the reticle R in the same manner as with an ordinary scanning-stepper.

In the stage controller 38, the reticle stage RST and the wafer stage WST1 (or WST2) are synchronized and controlled with the above-mentioned linear motors that constitute the wafer stage driving system and the reticle driver 26 so that the moving speed Vr in the Y-axis direction of the reticle stage RST and moving speed Vw in the Y-axis direction of the wafer stage WST1 (or WST2) can be maintained at a speed ratio that is a function of the projection magnification (¼× or ⅕×) of the projection optical system PL, particularly, during the scanning exposure.

Furthermore, as different pattern regions of the reticle R are consecutively illuminated by the ultraviolet pulse light beam and illumination of the entire pattern (on the reticle) is completed, scanning exposure of the first shot region on the wafer W1 (or W2) is completed. By this operation, the pattern of the reticle R is reduced and transferred to the first shot region by the projection optical system PL.

Furthermore, in the undepicted blind driving device, based on the instructions from the stage controller 38, movement of a blade of the movable reticle blind is synchronized and controlled with movement of the reticle stage RST so that irradiation of the ultraviolet pulse light beam is shielded from areas other than the pattern region on the reticle R immediately after scanning exposure is completed.

As mentioned above, when scanning exposure of the first shot region is completed, based on the instruction from the main controller 16, the wafer stage WST1 (or WST2) is stepped in the X and Y-axis directions by the linear motors 114A, 66C and 66D that constitute the wafer stage driving system and moves to a scanning start position for exposure of the second shot region. During this stepping operation, in the stage controller 38, based on the measurement values of the interferometers 33a and 32a having the measurement axes BI1Y and BI1X of the interferometer systems, position displacement in the X, Y, and θz directions of the wafer stage WST1 (or WST2) is measured in real time. Based on the results of these measurements, in the stage controller 38, the position of the wafer stage WST1 (or WST2) is controlled so that the XY position displacement of the wafer stage WST1 (or WST2) will be in a predetermined state. Furthermore, in the stage controller 38, based on the information of displacement in the θz direction of the wafer stage WST1 (or WST2), the reticle driver 26 is controlled in order to rotate of the reticle stage RST (the reticle fine movement stage), and discrepancy of rotational displacement of the wafer side can be corrected.

Furthermore, in response to the instruction of the main controller 16, the stage controller 38 and the laser controller 18 control their respective parts in the same manner as described above so that scanning exposure is performed with respect to the second shot region on the wafer W1 (or W2). Thus, scanning exposure of a shot region on the wafer W1 (or W2) and stepping operation for exposure of the following shot region are repeatedly performed, so that a pattern of the reticle R is sequentially transferred to all of the shot regions to be exposed on the wafer.

Additionally, the accumulated (total) exposure amount that is to given to the respective points on the wafer during the scanning exposure is controlled by the main controller 16, which controls one or both of the laser controller 18 and the stage controller 38 to control at least one of: (a) the scanning speed of the reticle stage and the wafer stage, (b) an extinction percentage of a light extinction unit within the illumination unit, (c) a pulse energy amount per pulse output from the light source, and (d) the oscillation frequency (pulse repeating frequency) of the light source.

Furthermore, in the main controller 16, for example, when a moving start position (synchronizing position) of the reticle stage and the wafer stage is changed during scanning exposure, changes of the stage position are instructed corresponding to the change amount with respect to the stage controller 38 that moves and controls the respective stages.

During scanning exposure, when the wafer stage WST1 is driven in the +Y direction (or in the −Y direction) integrally with the moving member 116 of the Y-axis linear motor 114A, a reaction force in the −Y direction (or in the +Y direction) is applied to the stationary member 76 of the Y-axis linear motion 114A. However, because the stage controller 38 appropriately controls a magnetic force generated by the electromagnets 86 that constitute the magnetic guide device 94, the reaction force can be canceled. In order to do this, the stage controller 38 controls the magnetic force generated by the electromagnets 86 that constitute the magnetic guide device 94 in response to (i.e., based upon) the thrust instruction value for the Y-axis linear motor 114A. Thus, in response to the reaction force and the driving force of the Y-axis linear motor 114A that drives the wafer stage WST1 in the Y-axis direction, the rigidity (i.e., the strength of the electromagnetic field) of the magnetic guide device 94 can be varied. By this operation, a reaction force that is generated as the wafer stage WST1 is driven in the Y-axis direction can be canceled. At the same time, movement (positional shift) of the second moving body 64 in the Y-axis direction is prevented. Thus, the reaction force will not cause oscillation of other parts of the device, so there is no need to provide a special mechanism to cancel the reaction force.

Meanwhile, during the stepping operation, the wafer stage WST1 is driven in the +X direction (or in the −X direction)

integrally with the second moving body 64 by the X-axis linear motors 66C and 66D. At this time, the reaction force of the driving force that acts on the moving members 74C and 74D of the X-axis linear motors 66C and 66D is applied to the respective stationary members 60C and 60D. However, these stationary members 60C and 60D are fixed to the base plate BP arranged on the floor surface, so that the reaction force that acts on the stationary members 60C and 60D is transferred to the floor surface via the base plate BP. Therefore, this reaction force does not cause oscillation of other structural members such as the stage fixed plate 44, which is supported on the base plate BP via an undepicted vibration control unit.

The above explanation also applies to the other wafer stage WST2 during scanning exposure and stepping thereof.

Additionally, in this embodiment, as described later, when step-and-scan type exposure is performed with respect to the wafer W1 on the wafer stage WST1, alignment or the like for the wafer W2 on the wafer stage WST2 is performed in parallel therewith. The wafer stage WST2 is driven in the Y- and X-axis directions by the Y-axis linear motor 114B and the X-axis linear motors 66A and 66B for alignment. At this point, in the same manner as described above, the stage controller 38 can adjust (vary) the rigidity of the magnetic guide device 92 in response to the reaction force and the driving force of the Y-axis linear motor 114B that drives the wafer stage WST2 in the Y-axis direction. By this operation, the reaction force that is generated when the wafer stage WST2 is driven in the Y-axis direction can be canceled. At the same time, movement (positional shift) of the first moving body 62 in the Y-axis direction is prevented. Thus, the reaction force will not cause oscillation of other parts of the device, so there is no need for a special mechanism that cancels the reaction force.

Furthermore, during alignment, for the same reasons as described above, the reaction force generated by the driving force that acts on the moving members 74A and 74B of the X-axis linear motors 66A and 66B is transferred to a floor surface from the stationary member by the base plate BP. Thus, there is no possibility that this reaction force causes oscillation of other structural members such as the stage fixed plate 44, which is supported on the base plate BP via the undepicted vibration control unit.

Therefore, in the exposure apparatus 10 of this embodiment, operation of one wafer stage hardly affects the other wafer stage.

A parallel process using two wafer stages, which is one aspect of the invention, is explained with reference to FIGS. 10, 12A–12C and 13C.

Figure 12A:
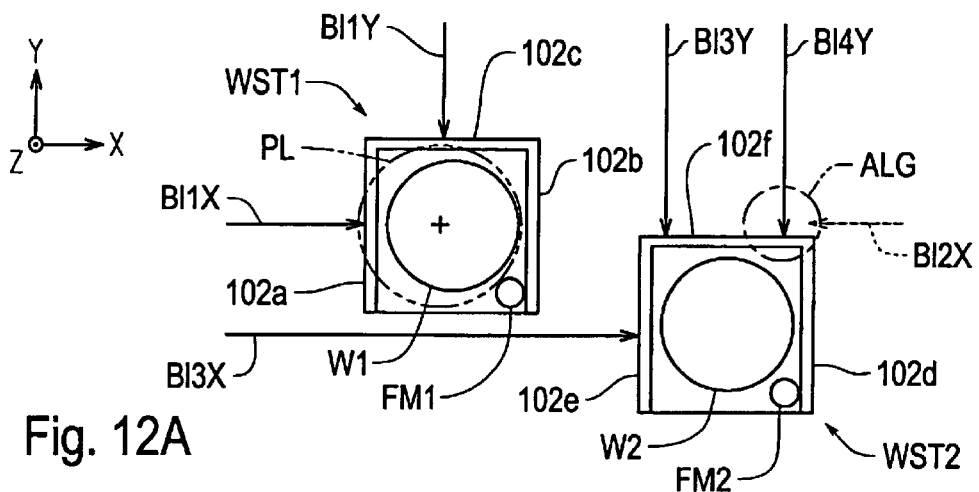
FIGS. 12A–12C are diagrams (number 1) showing a flow of operation during parallel processing using two wafer stages.

FIG. 12A shows a plan view of a state immediately after wafer replacement has been performed by the wafer loader 50 and an undepicted handling mechanism to load wafer W2 onto the wafer stage WST2, located at a predetermined loading position, while an exposure operation is performed, as described earlier, by the projection optical system PL with respect to the wafer W1 on the wafer stage WST1. The position (including yawing, i.e., θz rotation) within the XY plane of the wafer stage WST2 during this wafer replacement is controlled by the stage controller 38 based on the measurement value of the Y-axis interferometer sub-system 35, that is, the interferometers 35a and 35b having the measurement axes BI3Y and BI4Y and the interferometer 32b having the measurement axis BI3X of the interferometer system 140.

Figure 12B:
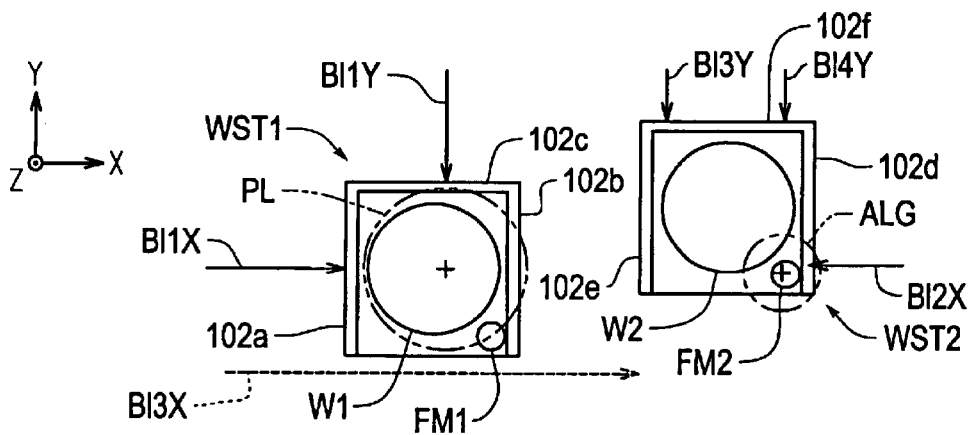

Next, in the stage control 38, as the measurement values of the three interferometers 32b, 35a and 35b are monitored, the Y-axis linear motor 114A (and the X-axis linear motors 66A and 66B and the X-axis direction support mechanism 130D, if needed) is controlled so that the wafer stage WST2 is moved in the +Y direction and is positioned at the alignment reference position shown in FIG. 12B. During the movement of wafer stage WST2, the exposure operation is continued in the wafer stage WST1 side.

The alignment reference position is a position at which a first reference mark (not depicted) on the reference mark plate FM2 of the wafer stage WST2 is located directly below the alignment optical system ALG.

Midway during the movement of the wafer stage WST2 from the FIG. 12A position to the FIG. 12B position, the interferometer beam from the interferometer 32b having the measurement axis BI3X does not fall upon the moving mirror 102e. Therefore, prior to this point in time, in the stage controller 38, while the interferometer beam from the interferometer 32b falls upon the moving mirror 102e, when the interferometer beam from the interferometer 34a having the measurement axis BI2X falls upon the moving mirror 102d, in response to the instruction from the main controller 16, the interferometer 34a is reset.

When the wafer stage WST2 is positioned at the alignment reference position shown in FIG. 12B, under the instruction of the main controller 16, the first reference mark can be detected. With respect to the detection of the first reference mark, an image of the first reference mark is taken in by the sensor of the FIA system of the alignment optical system ALG, and the image signal is sent to the alignment controller 136. In the alignment controller 136, predetermined processing is performed for the image signal, and by analyzing the processed signal, the position of the first reference mark in which the indication center of the sensor of the FIA system of the alignment optical system ALG reference is detected as a reference. In the main controller 16, based on the measurement result of the interferometers 34a and 35b having the respective measurement axes BI2X and BI4Y and the position of the first reference mark, a coordinate position of the first reference mark on the reference mark plate FM2 in the coordinate system (hereafter referred to as "stage coordinate system during alignment") using the measurement axes BI2X and BI4Y is calculated. During this time, the exposure operation is still continued in the wafer stage WST1 side.

Subsequently, in the reference stage WST2 side, prior to fine alignment, which will be discussed later, search alignment is performed. This search alignment has significant positional errors if pre-alignment is only used when the wafer W2 is propagated, so reference is made to pre-alignment that is again performed on the wafer WST2. Specifically, the positions of three search alignment marks (not depicted) formed on the wafer W2 mounted on the wafer stage WST2 are measured by using a sensor or the like of the LSA system of the alignment optical system ALG. Based on the measurement result, a positional shift in the X, Y and θz directions of the wafer W2 is measured. Operation of the respective parts during the search alignment is controlled by the main controller 16.

After this search alignment is completed, fine alignment is performed in which the arrangement of the shot regions on the wafer W2 is obtained by using the EGA process. Specifically, based on the measurement values of the interferometers 34a and 35b having the respective measurement axes BI2X and BI4Y, the position of the wafer stage WST2 is controlled. At the same time, based on the shot alignment data (alignment mark positional data), which depends on the design of the circuit being patterned, the wafer stage WST2 is sequentially moved, and the alignment mark position of a predetermined sample shot region on the wafer W2 is measured by a sensor or the like of the FIA system of the alignment optical system ALG. Based on the design coordinate data of the shot arrangement and the measurement result, the entire shot arrangement data is statistically calculated by a least squares method. By this operation, a coordinate position of respective shot regions can be calculated on the stage coordinate system during alignment. Additionally, the operation of the respective parts during this EGA process is controlled by the main controller 16, and the calculation is performed by the main controller 16.

Furthermore, in the controller 16, by subtracting the coordinate position of the first reference mark from the coordinate position of the respective shot regions, the relative positional relationship of the respective shot regions for the first reference mark is calculated. As shown in FIG. 10, the exposure operation is continued in the wafer stage WST1 side while the alignment operation is being performed in the wafer stage WST2 side.

With respect to the alignment operation (alignment sequence) and the exposure operation (exposure sequence) that are performed on the two wafer stages WST1 and WST2 in parallel as shown in FIG. 10, the wafer stage that is first completed will be in a waiting state, and replacement of the wafer stages WST1 and WST2 that will be discussed later begins when the operation of both stages is completed. As an example, the wafer stages WST1 and WST2 are located at a position shown in FIG. 12C when the operation of both stages is completed.

Figure 12C:
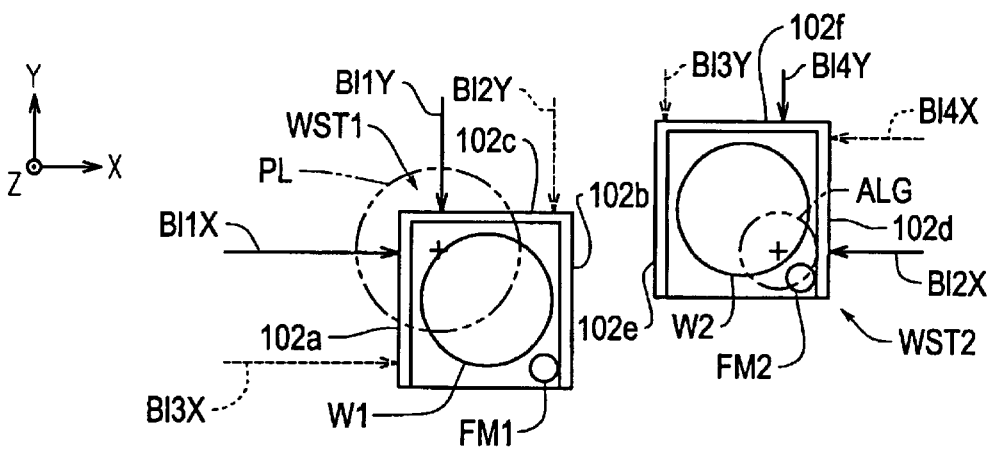

In the state shown in FIG. 12C, based on the measurement values of the interferometers 32a and 33a having the respective measurement axes BI1X and BI1Y, the position of the wafer stage WST1 is controlled by the stage controller 38 under the instruction of the main controller 16. Furthermore, the position of the wafer stage WST2 is controlled by the stage controller 38 under the instruction of the main controller 16 based on the measurement values of the interferometers 34a and 35b having the respective measurement axes BI2X and BI4Y.

Additionally, in the state shown in FIG. 12C, the interferometer beams from the interferometers 33b, 32b, 35a, and 34b having the respective measurement axes BI2Y, BI3X, BI3Y, and BI4X fall upon the moving mirrors on the respective wafer stages, so these interferometers are preset in the stage controller 38 in response to an instruction from the main controller 16. In the stage controller 38, based on the measurement value of the interferometer 32a having the measurement axis BI1X, by controlling the X-axis direction support mechanism 130C, yawing of the wafer stage WST1 is corrected. In this state, by setting the Y position that is measured by the interferometer 33a as an initial value of the interferometer 33b having the measurement axis BI2Y at that time, the interferometer 33b is preset. At the same time, by setting the X position that is measured by the interferometer 32a as an initial value of the interferometer 32b having the measurement axis BI3X at that time, the interferometer 32b is preset. In the same manner, in the stage controller 38, based on the measurement value of the interferometer 34a having by the measurement axis BI2X, by controlling the X-axis direction support mechanism 130D, yawing of the wafer stage WST2 is corrected. In this state, by setting the Y position that is measured by the interferometer 35b as an initial value of the interferometer 35c having the measurement axis BI3Y at that time, the interferometer 35c is preset. At the same time, by setting the X position that is measured by the interferometer 34a as an initial value of the interferometer 34b having the measurement axis BI4X at that time, the interferometer 34b is preset.

Figure 13A:
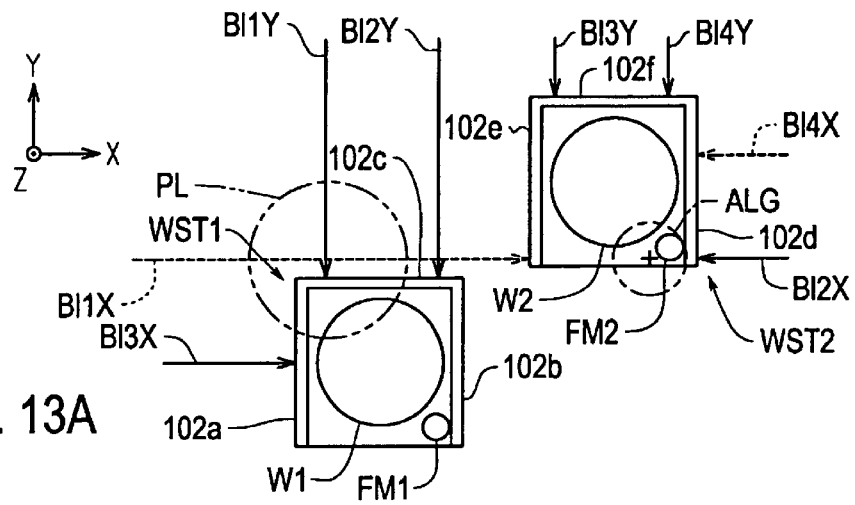
FIGS. 13A–13C are diagrams (number 2) showing a flow of operation during parallel processing using two wafer stages.

Next, in the stage controller 38, as the measurement values of the interferometers having the respective measurement axes BI1X, BI3X, BI1Y and BI2Y are monitored, the wafer stage WST1 is moved in the −Y direction toward the position shown in FIG. 13A. With respect to the movement, the stage controller 38 controls the Y-axis linear motors 114A and 114B. In the midst of this movement (from the FIG. 12C position to the FIG. 13A position), the interferometer beam from the interferometer 32a having the measurement axis BI1X no longer intercepts the moving mirror 102a on the wafer stage WST1, but instead is irradiated to the moving mirror 102e of the wafer stage WST2 side at the moment when it no longer intercepts the moving mirror 102a.

When the wafer stages move to the position shown in FIG. 13A, in the stage controller 38, in response to the instruction from the main controller 16, movement of the wafer stage WST1 in the +X direction begins. At the same time, movement of the wafer stage WST2 in the −X direction begins. Movement of the wafer stages is performed as the stage controller 38 controls the X-axis linear motors 66A–66D. In the state shown in FIG. 13A, the position of the wafer stage WST1 is controlled by the stage controller 38 based on the measurement values of the interferometers having the respective measurement axes BI1Y, BI2Y and BI3X.

Figure 13B:
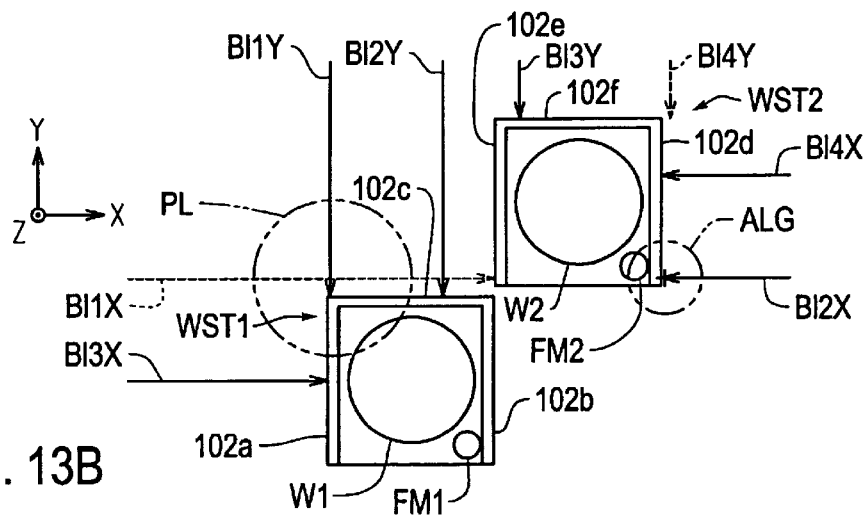
Figure 13C:
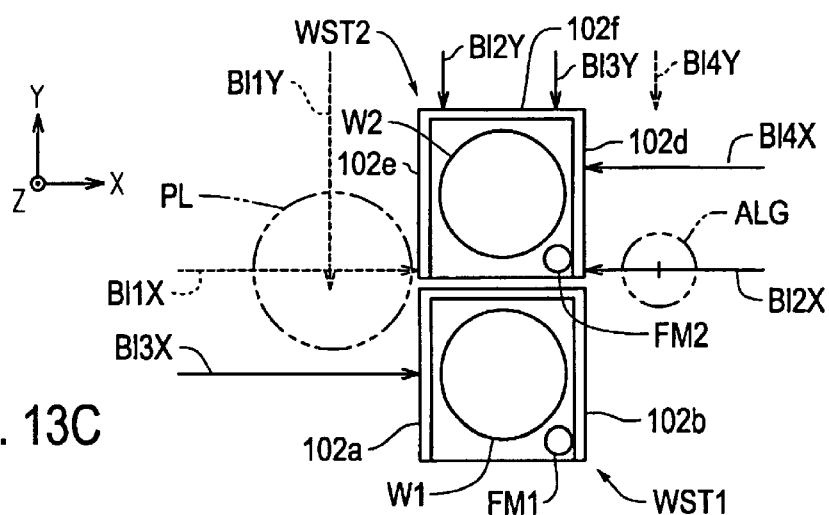

Additionally, after movement of both wafer stages begin, when both wafer stages reach the position shown in FIG. 13B, the interferometer beam from the interferometer 35b having the measurement axis BI4Y does not strike the moving mirror 102f of the wafer stage WST2 side. Thereafter, the position of the wafer stage WST2 is controlled based on the measurement value of the interferometers 35a, 34a and 34b having the respective measurement axes BI3Y, BI2X and BI4X.

From the state shown in FIG. 13B, as the wafer stage WST1 moves in the +X direction and the wafer side WST2 moves in the −X direction, the measurement beam from the interferometer 33a having the measurement axis BI1Y will stop intercepting the moving mirror 102c on the wafer stage WST1. Hereafter, the position of the wafer stage WST1 is controlled based on the measurement values of the interferometers 32b and 33b having the respective measurement axes BI3X and BI2Y. Hereafter, if the wafer stage WST1 further moves in the +X direction and the wafer stage WST2 moves in the −X direction, the interferometer beam from the interferometer 33b having the measurement axis BI2Y that is intercepted by the moving mirror 102c of the wafer stage WST1 will be intercepted by the moving mirror 102f of the wafer stage WST2. Therefore, in the stage controller 38, in response to the instruction from the main controller 16, by setting the measurement value of the interferometer 35e having the measurement axis BI3Y as an initial value of the interferometer 33b having the measurement axis BI2Y, the interferometer 33b is preset.

Hereafter, the position of the wafer stage WST1 is controlled based only on the measurement value of the interferometer having the measurement axis BI3X. The position of the wafer stage WST2 is controlled based on the measurement values of the four interferometers having the respective measurement axes BI2Y, BI3Y, BI4X and BI2X. Furthermore, if the wafer stage WST1 moves in the +X direction for a predetermined micro distance from this point and the wafer stage WST2 moves in the −X direction, both wafer stages reach the FIG. 13C position for replacing (swapping) the wafer stages. FIG. 9A shows the wafer stage WST1 that has reached this replacing position. In the position of FIG. 9A, the wafer stage WST1 is non-contactingly supported by the support frame 78 due to the support force (a force in which a magnetic attraction and a preloaded hydrostatic pressure are balanced (equal and opposite)) of the X-axis direction support mechanism 130A of the second moving body 64 side, which is controlled by the stage controller 38. Furthermore, the wafer stage WST1 is prevented from contacting the support frame 70 due to a support force (in this case, a preloaded hydrostatic pressure) of the X-axis direction support mechanism 130B.

In the same manner, in the replacing position, the wafer stage WST2 is non contactingly supported by the support frame 70 due to the support force (a force in which a magnetic attraction and a preloaded hydrostatic pressure are balanced (equal and opposite)) of the X-axis direction support mechanism 130D of the first moving body 62 side, which is controlled by the stage controller 38. Furthermore, the wafer stage WST2 is prevented from contacting the support frame 78 due to a support force (in this case, a preloaded hydrostatic pressure) of the X-axis direction support mechanism 130C.

Next, in the stage controller 38, a magnetic attraction is generated in the electromagnets 124 that constitute the X-axis direction support mechanism 130B. At the same time, generation of a magnetic attraction of the electromagnets 124 that constitute the X-axis direction support mechanism 130A is suspended. Accordingly, the wafer stage WST1 becomes non-contactingly supported by the support frame 70 of the first moving body 62 side. At the same time, in the stage controller 38, a magnetic attraction is generated in the electromagnets 124 that constitute that X-axis direction support mechanism 130C, and generation of a magnetic attraction of the electromagnets 124 that constitute the X-axis direction support mechanism 130D is suspended. Accordingly, the wafer stage WST2 becomes non-contactingly supported by the support frame 78 of the second moving body 64 side. After that, as described later, as the wafer stage WST1 is moved in the +X direction along with the first moving body 62, and the wafer stage WST2 is moved in the −X direction along with the second moving body 62, replacement between the wafer stage WST1 and the wafer stage WST2, that is, replacement of holding the wafer stages by the first moving body 62 and by the second moving body 64 is performed in a non-contact manner (i.e., the wafer stages are replaced (swapped) without physically contacting the stages).

After the magnetic generation of the electromagnets 124 in the replacing position is performed, in the stage controller 38, in response to the instruction of the main controller 16, the wafer stage WST1 begins to move in the +X direction toward the loading position. At the same time, the wafer stage WST2 begins to move in the −X direction toward the lower side of the projection optical system PL, which is an exposure position. At this time, in the stage controller 38, the position of the wafer stage WST2 is controlled based on the measurement values of the four interferometers having the respective measurement axes BI2Y, BI3Y, BI4X and BI2X (see FIG. 13C). The position of the wafer stage WST1 is controlled based on the measurement value of the interferometer 32b having the measurement axis BI3X.

By this operation, when the movement in the +X direction of the wafer stage WST1 and the movement in the −X direction of the wafer stage WST2 begin, the measurement beam from the interferometer 35a having the measurement axis BI3Y immediately stops being intercepted by the moving mirror 102f of the wafer stage WST2 side and simultaneously falls upon the moving mirror 102c of the wafer stage WST1 side. Therefore, in the stage controller 38, at this point, by setting an appropriate value as an initial value of the interferometer 35a having the measurement axis BI3Y, the interferometer is preset. Hereafter, in the stage controller 38, the position of the wafer stage WST1 is controlled based on the measurement values of the interferometers 32b and 35a having the measurement axes BI3X and BI3Y. At the same time, the position of the wafer stage WST2 is controlled based on the measurement values of the interferometers 33b, 34b and 34a having the respective measurement axes BI2Y, BI4X and BI2X.

Figure 14A:
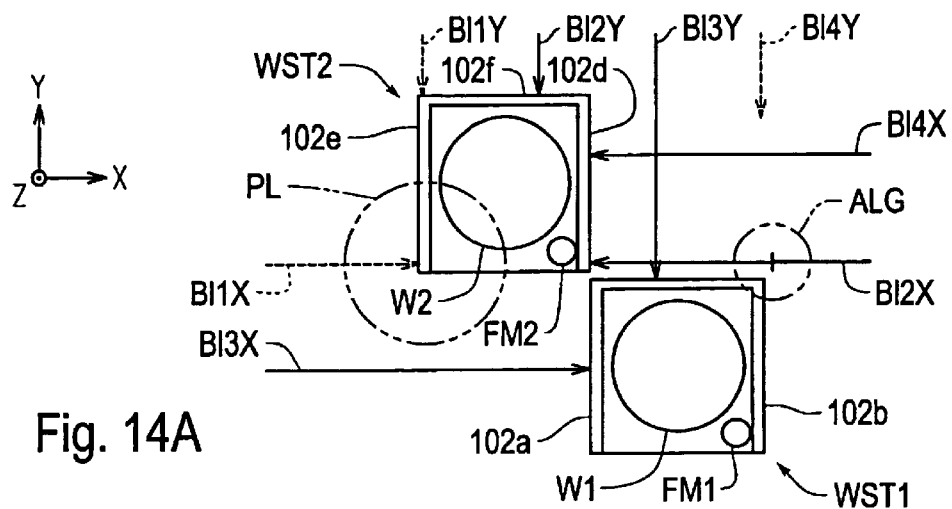
FIGS. 14A–14C are diagrams (number 3) showing a flow of operation during parallel processing using two wafer stages.

Once the wafer stage WST1 continues to move in the +X direction and the wafer stage WST2 moves in the −X direction, as shown in FIG. 14A, the interferometer beam from the interferometer 33a having the measurement axis BI1Y falls upon the moving mirror 102f of the wafer stage WST2. Therefore, in the stage controller 38, by setting the measurement value of the interferometer 33b having the measurement axis BI2Y as an initial value of the interferometer 33a having the measurement axis BI1Y, the interferometer 33a is preset. At the same time, the interferometer 32a having the measurement axis BI1X is reset. Hereafter, in the stage controller 38, based on the measurement values of the interferometers 32a and 33a having the respective measurement axes BI1X and BI1Y, the position of the wafer stage WST2 is controlled with respect to a coordinate system (hereafter referred to as "stage coordinate system during exposure") using the measurement axes BI1X and BI1Y.

Figure 14B:
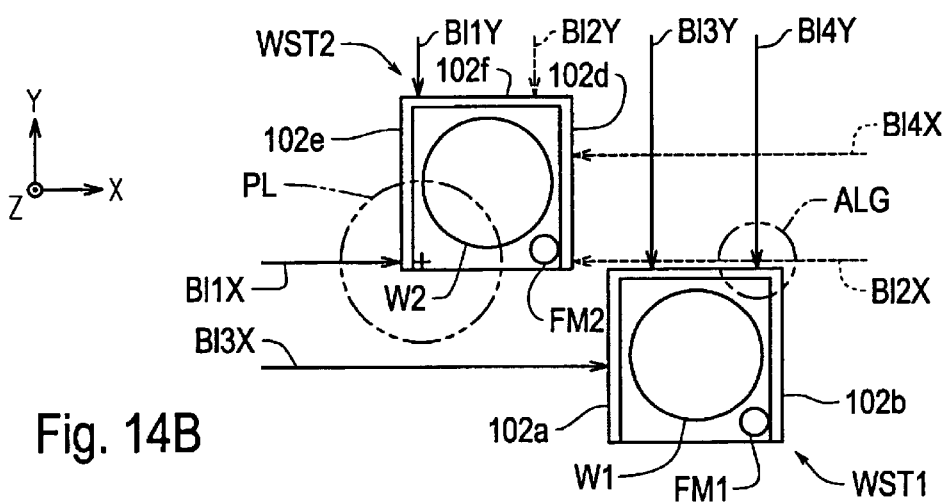
Figure 14C:
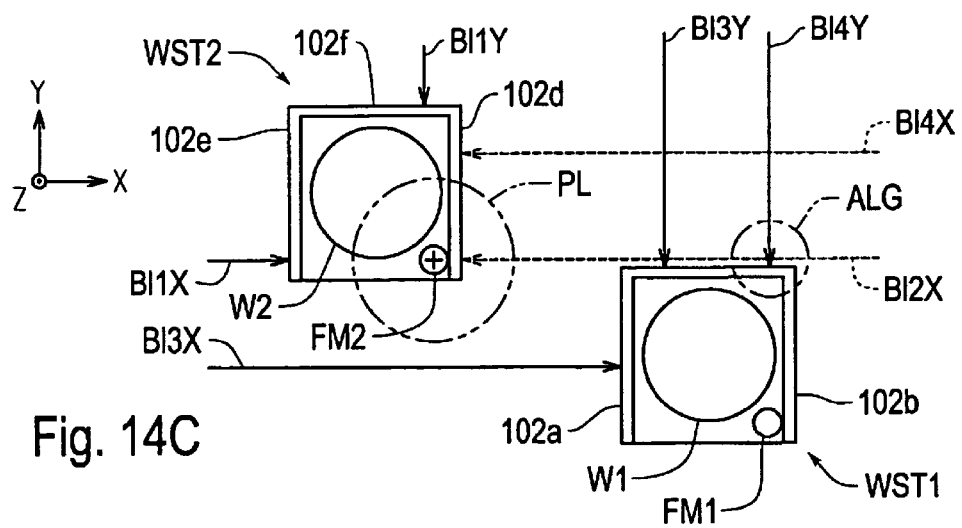

Subsequently, in stage controller 38, the wafer stage WST1 is moved in the +X direction. At the same time, the wafer stage WST2 is moved in the −X direction. Thus, immediately before the wafer stage WST1 reaches the loading position, the interferometer beam from the interferometer 35b having the measurement axis BI4Y falls upon the moving mirror 102c of the wafer stage WST1. Then, in the stage controller 38, by setting the measurement value of the interferometer 35a having the measurement axis BI3Y as an initial value of the interferometer 35b, the interferometer 35b is preset. Thus, FIG. 14B shows a state in which the wafer stage WST1 is positioned at the loading position.

At this loading position, wafer replacement is performed on the wafer stage WST1. During this time, in the stage controller 38, as the wafer stage WST2 is positioned and controlled on the stage coordinate system for exposure, it is positioned at an exposure reference position shown in FIG. 14C. The exposure reference position is a position at which the reference mark plate FM2 (or FM1) on the wafer stage WST2 (or WST1) is located at the optical axis AX of the projection optical system.

When the wafer stage WST2 is positioned at the exposure reference position, under the control of the main controller 16, detection of a pair of second reference marks on the reference mark plate FM2 and of the relative position of a projected image of reticle marks (corresponding to the pair of second reference marks) onto the wafer surface, is performed by the pair of reticle alignment microscopes (not depicted) using an exposure light beam. By this operation, a coordinate position of the pair of second reference marks on the reference mark plate FM2 in the coordinate system (stage coordinate system during exposure) using the measurement axes BI1X and BI1Y and a projection image coordinate position on the wafer surface of the marks on the reticle R can be detected. By determining the difference of these two measurements, a relative positional relationship of the coordinate position of the pair of second reference marks on the reference mark plate FM2 and an exposure position (projection center of the projection optical system PL) can be obtained.

Additionally, in the main controller 16, based upon the relative positional relationship between the respective shot regions on the wafer W2 previously determined for the first reference mark on the reference mark plate FM2 and a relative positional relationship between the coordinate position of the pair of second reference marks on the reference mark plate FM2 and the exposure position, the relative positional relationship can be calculated between the respective shot regions and the exposure position. Then, based on the result of this calculation, in the same case as for the wafer W1, scanning exposure is performed by sequentially positioning the wafer stage WST2 at a scanning start position for exposure of each of the shot regions on the wafer W2, and then exposing each shot region by synchronously scanning the reticle stage RST with the wafer stage WST2 in the scanning direction (Y-direction) relative to the projection optical system PL.

When the exposure operation on the wafer W2 is performed in parallel with a wafer replacement operation that is performed on another wafer (wafer W1), wafer replacement followed by movement of the wafer stage WST1 to the alignment reference position in the same manner as described earlier, search alignment, and fine alignment are performed on wafer W1 during exposure of wafer W2.

Subsequently, in the same manner as described above, while the wafer stages WST1 and WST2 are independently moved in a two-dimensional direction (in the XY plane), an exposure sequence of the wafer on one wafer stage, and parallel (simultaneous) processing including wafer replacement and an alignment sequence of another wafer on the other stage are repeatedly performed.

In this embodiment, during a series of sequences from the alignment sequence to the exposure sequence, as described above, a reset operation and a preset operation of the interferometers are performed. However, when the respective shot regions on the wafer are exposed, superimposition of the reticle pattern and each of the respective shot regions on the wafer can be performed with high accuracy. This is because, after the first reference mark on the reference mark plate FM2 (or FM1) is measured by the alignment optical system ALG, by measuring the alignment marks of the respective shot regions on the wafer W2 (or W1), the interval between the reference mark and the imaginary position calculated by the measurement of the wafer marks is calculated by the same sensor. At this point, the relative positional relationship (relative distance) of the position to be exposed and the reference mark is obtained. Therefore, if the reference mark position corresponds to the exposure position by the reticle alignment microscopes prior to exposure, by adding the relative distance to the calculated value, even if the interferometer beam of the interferometer is turned off during the wafer stage movement, performance of the resetting and presetting described above enables the exposure operation to be performed with high accuracy.

In the exposure apparatus 10 according to this embodiment, by performing the exposure process in parallel with the replacement/alignment process using the above-described wafer stages WST1 and WST2, throughput can be significantly improved compared to the case in which wafer replacement, followed by alignment, followed by exposure, followed by wafer replacement is sequentially performed.

In this case, in the stage device 12 that constitutes the exposure apparatus 10 of this embodiment, as described above, one stage is not affected by the reaction force that is generated by the movement of another wafer stage. Therefore, the operation(s) performed on one wafer stage does not negatively act on the operation(s) performed on another wafer stage. Therefore, in this embodiment, regardless of the operations performed on the wafer stages WST1 and WST2, a reticle pattern can be transferred to a wafer with high accuracy without being affect by the operation of the other wafer stage. Accordingly, in this embodiment, there is no need to coordinate the timing of the respective operations that are performed on one stage with the operations that are performed on the other stage. Therefore, there is no situation in which one particular operation cannot be performed on one stage simultaneously with the performance of another particular operation on the other stage due to the concern that there will be a negative affect of one operation on the other operation. Rather, the operations performed on the two stages can be performed independently of each other.

As explained above in detail, in the stage device 12 of this embodiment, the stage controller 38, which is instructed by the main controller 16, controls the X-axis linear motors 66A–66D and the X-axis direction support mechanisms 130A–130D as described earlier so as to contactingly replace the wafer stages WST1 and WST2 with respect to the first and second moving bodies 62 and 64. Thus, in this embodiment, a replacing device and a positioning device are constituted by the X-axis linear motors 66A–66D, the X-axis direction support mechanisms 130A–130D, and the stage controller 38 that controls these motors and mechanisms. Replacement of the wafer stages WST1 and WST2 is non-contactingly performed, so that during replacement, in contrast to the case of the rigid connection mechanism previously disclosed, there is no shock force to the respective stages, and generation of a positional shift to the wafer W mounted on the respective stages can be prevented. Additionally, the stage main body 100 that constitutes each of the wafer stages WST1 and WST2 has moving members 118 and 116 that form the Y-axis linear motors 114A and 114B along with the stationary members 68 and 76, so that both stages WST1 and WST2 can be independently driven in the Y-direction in parallel due to a Lorentz force generated by these linear motors. Furthermore, in this case, as describe above, the replacing device is provided with the X-axis linear motors 66A and 66B that drive the first moving body 62 in the X-axis direction and the X-axis linear motors 66C and 66D that drive the second moving body 64 in the X-axis direction. Therefore, the first and second stages can be independently driven in the two-dimensional directions in parallel (simultaneously), and separate processing (e.g., exposure and alignment) can be simultaneously performed in parallel with respect to the wafers W1 and W2 mounted on the wafer stages WST1 and WST2.

Furthermore, in the stage device 12, the stationary member 68 is supported by the support frame 70 at the first position in the Z-axis direction. In addition, the stationary member 76 is supported by the support frame 78 at the second position in the Z-axis direction. Therefore, the stage controller 38 controls the X-axis linear motors 66A and 66B, moves the stationary member 68 toward the wafer stage WST1 from the +X side, and inserts the stationary member 68 into the space of the moving member 118 of the stage main body 100. In the same manner, as the stage controller moves the stationary member 76 toward the wafer stage WST1 from the −X side and inserts the stationary member 76 into the space of the moving member 116 of the stage main body 100, the moving member 118 and the stationary member 68, and the moving member 116 and the stationary member 76 can non-contactingly position the wafer stage WST1 at a position that can generate a Lorentz force simultaneously. This also is performed for the wafer stage WST2 side. That is, in this embodiment, the positioning device is constituted by the X-axis linear motors 66A–66D, the X-axis direction support mechanisms 130A–130D, and the stage controller 38 that controls these motors and mechanisms. Because of this, during positioning, in contrast to the case of the rigid connection mechanism previously disclosed, a shock force does not act on the stage main body 100. Therefore, generation of a positional shift to the wafers W1 and W2 mounted to the substrate table 98 on the stage main body 100 is prevented.

Furthermore, in the stage device 12 of this embodiment: (i) the electromagnets 86 are included at both ends in the Y-axis direction of the first moving body 62 which has the stationary member 68, (ii) the magnetic guide device 92 is included, which non-contactingly supports the first moving body 62 by a magnetic force with respect to the first direction, and (iii) a magnetic force (force in the Y-axis direction) of the respective electromagnets 86 that constitute this magnetic guide device 92 is controlled by the stage controller 38. As the respective electromagnets 86 are controlled by the stage controller 38, for example, so as to keep the magnetic force constant, the first moving body 62 is non-contactingly supported with a predetermined clearance with respect to the frames 58A and 58B (in which the iron plates 88 and 90 are respectively arranged) as support members, and the first moving body 62 is driven in the X-axis direction along with the wafer stages WST1 and WST2 due to a Lorentz force generated by an electromagnetic interaction between the stationary members 60A/60B and the moving members 74A/74B of the X-axis linear motors 66A and 66B arranged at both ends in the Y-axis direction of the first moving body 62. Therefore, there is no need to provide another air guide or the like for the purpose of supporting the first moving body 62 in the Y-axis direction.

Furthermore, when the wafer stage (WST1 or WST2) is driven in the Y-axis direction by the Lorentz force generated between any of the moving members of the stage main body 100 and the stationary member 68 of the first moving body 62 side, a reaction force corresponding to the driving force acts on the stationary member 68. However, because the stage controller 38 adjusts a magnetic force of the magnetic guide device 92, the reaction force can be canceled. Therefore, there is no need to provide a reaction force cancellation mechanism that cancels a reaction force that is generated in the stationary member 68 when the wafer stage is driven in the Y-axis direction. In this case, in the stage controller 38, in response to a driving instruction value of the Y-axis direction of the respective wafer stages, a magnetic force of the magnetic guide device 92 is controlled. Thus, in this embodiment, the stage controller 38 also plays a role of a magnetic force controller.

In the same manner: (i) the electromagnets 86 are included at both ends in the Y-axis direction of the second moving body 64, which includes the stationary member 76, (ii) the magnetic guide device 94 is included, which non-contactingly supports the first moving body 62 with a magnetic force with respect to the first direction, and (iii) the stage controller 38 controls a magnetic force (force in the Y-axis direction) of the respective electromagnets 86 that constitute the magnetic guide device 94. Therefore, for the same reasons described above, there is no need to provide a reaction force cancellation mechanism that cancels a reaction force that is generated in the stationary member 76 when the wafer stage is driven in the Y-axis direction.

Therefore, in the stage device 12 of this embodiment, the ability to control the position of the wafer stages WST1 and WST2 can be improved. At the same time, it is not necessary to provide an air guide that guides the wafer stages WST1 and WST2 in the X-axis direction and a rigid part that implements the air guide. This reduces the weight of the movable parts of the stage device, which makes it possible to achieve higher acceleration (resulting in higher throughput), and to reduce the electric consumption for driving the motors. Additionally, there is no need to provide a reaction force cancellation mechanism or the like, and therefore the weight of the entire stage device can be reduced.

Furthermore, the stationary members 60A–60D of the X-axis linear motors 66A–66D are supported by the respective frames 58A–58D fixed to the base plate BP, which is mounted on a floor independently from the stage fixed plate 44. Therefore, when the wafer stages WST1 and the WST2 (moving bodies 62, 64) are driven in the X-axis direction, a reaction force that is generated in the respective stationary members of the X-axis linear motors 66A–66D is transferred to the floor via the respective frames from the respective stationary members. The reaction force is not directly transmitted to the stage fixed plate 44 that is supported via a vibration control unit, and does not cause oscillation of the stage fixed plate 44 and the wafer stages WST1 and WST2 that are floatingly supported by a bearing device with respect to the stage fixed plate 44.

In the stage device 12 of this embodiment, as described above, in the respective locations, a vacuum preload hydrostatic bearing device is used. However, as the bearing device, if a type is used that has an air emitting groove that passes through a vacuum air outlet path in the vicinity of an exhaust nozzle of pressure gas in the bearing surface, gas that is exhausted from the bearing device to the guide surface is immediately vacuum-emitted, so gas leakage to the surrounding area can be prevented. This is particularly useful in a super-high vacuum environment in addition to an environment in which contamination in the surrounding gas by gas leakage is intolerable, that is, in which purity of helium or the like must be kept high, as described in this embodiment.

Furthermore, in the exposure apparatus 10 of this embodiment, as described above, the ability to control the position of the wafer stages WST1 and WST2 that constitute the stage device 12 can be improved. Therefore, as the reticle R and the wafers W1 and W2 are synchronously moved, when the pattern of the reticle R is transferred onto the wafer W1 or W2 by the projection optical system PL, follow-up accuracy can be improved with respect to the reticle R of the wafer W1 or W2 held by the wafer stage WST1 or WST2. Synchronization accuracy between the reticle R and the wafer W1 or W2 can be improved, and the synchronization adjustment time can be shortened. Therefore, exposure accuracy and throughput can be improved.

Furthermore, in the exposure apparatus 10 of this embodiment, when the two wafer stages WST1 and WST2 are provided in which two wafers are respectively held independently, the two wafer stages are independently moved in the XY direction. When wafer replacement and alignment operation are being performed on one wafer stage, exposure operation is performed on the other wafer stage, and when both operations are completed, such operations are switched. Therefore, throughput can be significantly improved compared to a conventional exposure apparatus repeating a sequence of wafer replacement, followed by alignment, followed by exposure using a single wafer stage.

Here, the wafer stages WST1 and WST2 need to be replaced (between the moving bodies 62, 64) when the above-mentioned operations are switched, but the respective wafer stages can be non-contactingly replaced with respect to the first and second moving bodies 62 and 64 having the stationary member 68 and 76. Therefore, when replacement is performed, generation of a positional shift due to a shock force to a wafer on the respective wafer stages can be prevented. By this operation, superimposing accuracy of the reticle R pattern and the wafers W1 and W2 can be improved.

Furthermore, when the above-mentioned operations are switched, the interferometer of the measurement axis that is used in the operation after switching is reset. At the same time, the measurement sequence of the reference mark plate arranged on the wafer stage also can be performed. Therefore, no inconvenience (or problem) is caused even if the measurement axis of the interferometer system does not intercept the moving mirror on the wafer stage, and therefore the length of the moving mirror on the wafer stage can be shortened. Thus, it is easier to make the wafer stage WST1 and WST2 small. Specifically, the length of the wafer stage in one dimension can be made to a size that is slightly larger than the wafer diameter. By this operation, it is easier to coordinate the movements of the two wafer stages (i.e., it is easier to avoid collision between the two wafer stages during movement), and the ability to control the position of the respective wafer stages can be improved.

Furthermore, in this embodiment, exposure is performed by using an vacuum-ultraviolet pulse light beam as an exposure illumination light beam, and therefore a micro-small pattern can be transferred onto a wafer with a high resolution.

Furthermore, highly pure helium gas or dry nitrogen gas is filled into the entire light path of the exposure illumination light, so transmission deterioration of the exposure illumination light beam (ultraviolet pulse light beam) can be prevented as much as possible, and exposure amount control can also be accurately performed.

Additionally, in the exposure apparatus 10, the wafer stage WST1 can be replaced with the wafer stage WST2, so that the provision of one alignment optical system ALG and one wafer loader, as a substrate replacing device, is sufficient for use with two wafer stages. Therefore, it is possible to make the exposure apparatus including the compartment 42 small (reducing the X-axis direction length) and to make its foot print narrow. Furthermore, wafer replacement for two wafer stages can be performed at one location, so an opening part (opening area) of the compartment 42 necessary for this purpose can be made smaller. By this operation, deterioration of the purity of helium gas within the compartment 42 can also be reduced.

Furthermore, according to this embodiment, the above-mentioned high throughput can be obtained, so deterioration of throughput hardly is affected even if the off-axis alignment optical system is significantly separated and arranged from the projection optical system PL. Because of this, a straight barrel type optical system with small aberration and a high numerical aperture can be used.

In addition, according to this embodiment, interferometer beams from interferometers that measure substantially the centers of the optical axes of the projection optical system PL and the alignment optical system, respectively, are provided for those two optical systems, so regardless of the case of alignment and the case of pattern exposure with the projection optical system, two wafer stage positions can be accurately measured in a state without Abbe's number, and two wafer stages can be accurately moved independently of each other.

The specific structure of the stage device of the above-described embodiment is one example of the invention; the structure of the stage device according to this invention is not limited to this one example. In the above-mentioned embodiment, two stages are provided from a perspective of throughput improvement by the above-mentioned simultaneous parallel processing, however the stage device according to the invention can also have only one two-dimensional moving stage. In this case as well, in the same manner, the previously explained improvement in the ability to control the stage position, improvement of an air guide that guides the stage in the X-axis direction (second direction), and reduction of rigid parts that implement the air guide are possible, and the movable parts of the stage device can be made light in weight. Furthermore, a higher acceleration stage (high throughput) and reduction of motor electric power consumption are also possible. Furthermore, there is no need to provide the reaction force cancellation mechanism or the like.

Furthermore, in this embodiment, three-surface reflection type moving mirrors (102*a*, 102*b*, 102*c*), (102*d*, 102*e*, 102*f*) are arranged on the respective wafer stages. However, two-surface reflection type moving mirrors can also be arranged as an alternative. In accordance with this modification, arrangement of the respective measurement axes of the interferometer systems can also be changed. Additionally, instead of the moving mirrors, mirror processing can be performed on two or three side surfaces of the substrate table 98, and these reflection surfaces can be used as the moving mirrors.

Additionally, in this embodiment, the illumination unit ILU has a housing 20, the reticle stage RST is housed in the reticle chamber 22, the stage device 12 is arranged within the compartment 42, and inert gas, such as helium gas or the like, is filled in the lens barrel of the projection optical system PL, the chambers 22 and 42, and the housing 14. The invention is not limited to this arrangement; rather the entire structural components of the exposure apparatus can also be housed within one chamber.

Furthermore, in the above-described embodiment, while exposure is being performed by using a pattern of one reticle on one wafer stage, wafer replacement, alignment, or the like is performed on other wafer stage. The invention is not limited to this arrangement; rather, as disclosed in, for example, Japanese Laid-Open Patent Application No. 10-214783, by using a reticle stage that can mount two reticles, double exposure can be performed by using a pattern of two reticles on one wafer stage, while wafer replacement, alignment, or the like is performed in parallel on the other wafer stage. By this operation, throughput is not significantly reduced by using simultaneous parallel processing, and high resolution and a DOF (depth of focus) can be effectively improved by double exposure.

While the described embodiment is a scanning stepper, the invention is not limited to scanning steppers. The stage device of this invention can also be applied to a stationary type exposure apparatus such as a stepper or the like that performs exposure while maintaining a mask and a substrate stationary. In this case as well, according to the stage device of the invention, the ability to control the position of a substrate stage that holds the substrate can be improved, so positioning of the substrate that is held in the stage can be improved, positioning adjustment time can also be shortened, and exposure accuracy and throughput can be improved.

The stage device of this invention also can be applied to a proximity exposure apparatus that transfers a pattern of a mask onto a substrate by contacting the mask with the substrate without using a projection optical system therebetween.

The invention is, of course, also applicable not only to an exposure apparatus for use in fabrication of semiconductor devices, but also to an exposure apparatus that transfers a device pattern onto a glass plate so as to produce displays, such as liquid crystal displays and plasma displays, an exposure apparatus that transfers a device pattern onto a ceramic wafer so as to produce thin-film magnetic heads, and an exposure apparatus for use in producing image pickup devices, such as CCDs.

The invention is also applicable not only to microdevices such as semiconductor devices, but also to an exposure apparatus that transfers a circuit pattern onto a glass substrate, a silicon wafer, and the like in order to manufacture a reticle or a mask for use in an optical exposure apparatus, an EUV (Extreme Ultraviolet) exposure apparatus, an X-ray exposure apparatus, an electron beam exposure apparatus, and the like. In an exposure apparatus using DUV (Deep Ultraviolet) light, VUV (Vacuum Ultraviolet) light, and the like, a transmissive reticle is generally used, and a reticle substrate is made of quartz glass, quartz glass doped with fluorine, fluorite, magnesium fluoride, or quartz crystal. In the proximity exposure apparatus or the electron beam exposure apparatus, a transmissive mask (a stencil mask or a membrane mask) is used. In the EUV exposure apparatus, a reflective mask is used, and a silicon wafer or the like is used as a mask substrate.

The stage device used in the exposure apparatus of the invention is also widely applicable to other substrate processing apparatus (for example, a laser apparatus or a substrate inspection apparatus), a sample positioning device in other precision machines, and a wire bonding device.

The exposure apparatus of the invention may employ not only the projection optical system, but also a charged particle beam optical system, such as an X-ray optical system or an electron optical system. For example, the electron optical system includes an electron lens and a polarizer, and thermoelectron-emitting lanthanum hexaborite (LaB$_6$) or tantalum (Ta) is used as an electron gun. Of course, the optical path through which an electron beam passes is placed in a vacuum. The exposure apparatus of the invention may use, as exposure light, not only the above-described far ultraviolet light or vacuum ultraviolet light, but also soft X-ray EUV light with a wavelength of 5 nm to 30 nm.

For example, the vacuum ultraviolet light includes ArF excimer laser light and F$_2$ laser light. Alternatively, a harmonic wave may be used which is obtained by amplifying single-wavelength laser light in an infrared region or a visible region emitted from a DFB semiconductor laser or a fiber laser by, for example, a fiber amplifier doped with erbium (or both erbium and ytterbium) and wavelength-converting the laser light into ultraviolet light by using nonlinear optical crystal. For example, when an oscillation wavelength of a single-wavelength laser is within a range of 1.51–1.59 $\mu$m, an eight-time harmonic wave within a generation wavelength range of 189–199 nm or a 10-time harmonic wave within a generation wavelength range of 151–159 nm is output. In particular, when an oscillation wavelength is within a range of 1.544–1.553 $\mu$m, an eight-time harmonic wave within a generation wavelength range of 193–194 nm, that is, an ultraviolet ray that becomes substantially the same wavelength as an ArF excimer laser light beam can be obtained. If the oscillation wavelength is within a range of 1.57–1.58 $\mu$m, a 10-time harmonic wave with a generation wavelength range of 157–158 nm, that is, an ultraviolet ray that becomes substantially the same wavelength as an F$_2$ laser light beam can be obtained.

Furthermore, if an oscillation wavelength is within a range of 1.03–1.12 $\mu$m, a seven-time harmonic wave with a generation wavelength range of 147–160 nm is output. In particular, if an oscillation wavelength is within a range of 1.099–1.106 $\mu$m, a seven-time harmonic wave with a generation wavelength range of 157–158 $\mu$m, that is, an ultraviolet ray that becomes substantially the same wavelength as an F$_2$ laser light beam can be obtained. In this case, as a single wavelength oscillation laser, for example, a yttrium-doped fiber laser can be used.

While the projection optical system is of a reduction type in the above embodiments, it may be of a 1×(unity) magnification type or of a magnification type.

In addition, the invention is not limited to the specific catadioptric type projection optical system illustrated in the drawings. A reduction system can also be used in which, for example, a round image field is provided, an object surface side and an image surface side (of the projection optical system) are both telecentric, and the projection magnification is ¼ or ⅕ times. Furthermore, a scanning type exposure apparatus provided with a catadioptric type projection optical system can also be a type in which an irradiation region of an illumination light beam passes through and extends across the center of the visual field along the optical axis of the projection optical system, and is regulated to have a rectangular slit shape extending along a direction substantially perpendicular to a scanning direction of the wafer and the reticle. According to the scanning type exposure apparatus provided with the catadioptric type projection optical system, for example, even if a wavelength of 157 nm of an F$_2$ laser light beam is used as an exposure illumination light beam, a micro-pattern that is an approximately 100 nm L/S pattern can be transferred onto a wafer with high accuracy.

As explained above, in a stage device according to one aspect of the invention, when a movable body is positioned with respect to two stationary side members, a shock force is prevented from acting on the movable body, and a positional shift of an object mounted on the movable body can be prevented.

Furthermore, according to another aspect of the invention, when two stages are replaced, a shock force can be prevented from acting on these stages. At the same time, separate processing can be performed in parallel with respect to an object mounted on these stages.

According to another aspect of the invention, the ability to control the position of a substrate on a stage and throughput can be simultaneously improved.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A stage device comprising:
   a first movable stage that moves in a first direction and a second direction different from the first direction, the first movable stage having a first reflective portion extending in the first direction, a second reflective portion parallel to the first reflective portion, and a first reference mark portion;
   a first position detector that detects a position of the first movable stage cooperating with the first reflective portion;
   a first mark detector that detects the first reference mark portion when the first position detector detects the position of the first movable stage;
   a second position detector that detects a position of the first movable stage cooperating with the second reflective portion;
   a second mark detector that detects the first reference mark portion when the second position detector detects the position of the first movable stage; and
   a controller that communicates with the first position detector, the second position detector, the first mark detector, and the second mark detector to correlate the first position detector with the second position detector.

2. A stage device according to claim 1, wherein at least one of the first mark detector and the second mark detector detects the first reference mark portion optically.

3. A stage device according to claim 1, wherein at least one of the first position detector and the second position detector comprises an interferometer system.

4. A stage device according to claim 1, further comprising a second movable stage that moves in the first direction and the second direction, the second movable stage having a third reflective portion extending in the first direction, a fourth reflective portion parallel to the third reflective portion, and a second reference mark portion.

5. A stage device according to claim 4, further comprising a replacer that replaces the first and second movable stages with respect to the first and second position detectors.

6. A stage device according to claim 5, wherein the first mark detector detects the second reference mark portion when the first position detector detects a position of the second movable stage cooperating with the third reflective portion.

7. A stage device according to claim 5, wherein the second mark detector detects the second reference mark portion when the second position detector detects a position of the second movable stage cooperating with the fourth reflective portion.

8. A stage device according to claim 4, wherein the second movable stage is a cantilevered stage.

9. A stage device according to claim 1, wherein the first movable stage is a cantilevered stage.

10. An exposure apparatus comprising:
    a first movable stage that moves in a first direction and a second direction different from the first direction, the first movable stage holding a first substrate and having a first reflective portion extending in the first direction, a second reflective portion parallel to the first reflective portion, and a first reference mark portion;
    a first position detector that detects a position of the first movable stage cooperating with the first reflective portion;
    a first mark detector that detects the first reference mark portion when the first position detector detects the position of the first movable stage;
    a second position detector that detects a position of the first movable stage cooperating with the second reflective portion;
    a second mark detector that detects the first reference mark portion when the second position detector detects the position of the first movable stage;
    a projection system that associates with the second mark detector to project a pattern onto a first substrate; and
    a controller that communicates with the first position detector, the second position detector, the first mark detector, and the second mark detector to correlate the first position detector with the second position detector.

11. An exposure apparatus according to claim 10, wherein at least one of the first mark detector and the second mark detector detects the first reference mark portion optically.

12. An exposure apparatus according to claim 10, wherein at least one of the first position detector and the second position detector comprises an interferometer system.

13. An exposure apparatus according to claim 10, further comprising a second movable stage that moves in the first direction and the second direction, the second movable stage holding a second substrate and having a third reflective portion extending in the first direction, a fourth reflective portion parallel to the third reflective portion, and a second reference mark portion.

14. An exposure apparatus according to claim 13, further comprising a replacer that replaces the first and second movable stages with respect to the first and second position detectors.

15. An exposure apparatus according to claim 14, wherein the first mark detector detects the second reference mark portion when the first position detector detects a position of the second movable stage cooperating with the third reflective portion.

16. An exposure apparatus according to claim 14, wherein the second mark detector detects the second reference mark portion when the second position detector detects a position of the second movable stage cooperating with the fourth reflective portion.

17. An exposure apparatus according to claim 13, wherein the second movable stage is a cantilevered stage.

* * * * *